(12) United States Patent
Hirochi

(10) Patent No.: US 10,131,990 B2
(45) Date of Patent: Nov. 20, 2018

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: HITACHI KOKUSAI ELECTRIC INC, Tokyo (JP)

(72) Inventor: Yukitomo Hirochi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/401,529

(22) Filed: Jan. 9, 2017

(65) Prior Publication Data

US 2017/0114457 A1   Apr. 27, 2017

Related U.S. Application Data

(62) Division of application No. 14/861,658, filed on Sep. 22, 2015, now abandoned.

(30) Foreign Application Priority Data

Aug. 27, 2015   (JP) ................................. 2015-167859

(51) Int. Cl.
*H01L 21/02* (2006.01)
*C23C 16/44* (2006.01)
(Continued)

(52) U.S. Cl.
CPC ........ *C23C 16/4412* (2013.01); *C23C 16/455* (2013.01); *C23C 16/45544* (2013.01);
(Continued)

(58) Field of Classification Search
None
See application file for complete search history.

(56) References Cited

U.S. PATENT DOCUMENTS 5,574,247 A * 11/1996 Nishitani ............ C23C 16/0245
                                                                  118/708
6,152,070 A   11/2000 Fairbairn et al.
(Continued)

FOREIGN PATENT DOCUMENTS

JP   2006-253629 A   9/2006
JP   2012-164736 A   8/2012
(Continued)

OTHER PUBLICATIONS

KR Notification of Reason for Refusal, KR Patent Application No. 10-2015-0132170, dated Jan. 18, 2017, 6 pages.

*Primary Examiner* — Shamim Ahmed
(74) *Attorney, Agent, or Firm* — Volpe and Koenig, P.C.

(57) ABSTRACT

In the present invention, the productivity of a processing apparatus including a plurality of process chambers is improved. There is provided a substrate processing apparatus including a plurality of process chambers, a process gas supply unit configured to supply a process gas into each of the plurality of process chambers, a purge gas supply unit configured to supply a purge gas into each of the plurality of process chambers, an exhaust unit configured to exhaust each of the plurality of process chambers and a control unit configured to control the process gas supply unit, the purge gas supply unit and the exhaust unit to supply the process gas into a first process chamber of the plurality of process chambers to which a substrate is transferred while supplying the purge gas into process chambers other than the first process chamber and exhausting the plurality of process chambers.

10 Claims, 12 Drawing Sheets

(51) Int. Cl.
  *C23C 16/455* (2006.01)
  *H01L 21/67* (2006.01)
  *H01L 21/677* (2006.01)
  *C23C 16/54* (2006.01)
  *C23C 16/46* (2006.01)

(52) U.S. Cl.
  CPC .. *C23C 16/45565* (2013.01); *C23C 16/45574* (2013.01); *C23C 16/46* (2013.01); *C23C 16/54* (2013.01); *H01L 21/0262* (2013.01); *H01L 21/67017* (2013.01); *H01L 21/6719* (2013.01); *H01L 21/67196* (2013.01); *H01L 21/67276* (2013.01); *H01L 21/67739* (2013.01); *H01L 21/67742* (2013.01)

(56) References Cited

U.S. PATENT DOCUMENTS

| | | | |
|---|---|---|---|
| 6,846,516 B2 | 1/2005 | Yang et al. | |
| 7,909,933 B2 | 3/2011 | Ishihara et al. | |
| 2003/0213560 A1 | 11/2003 | Wang et al. | |
| 2004/0026037 A1* | 2/2004 | Shinriki | C23C 16/40 156/345.33 |
| 2009/0214758 A1 | 8/2009 | Kannan | |
| 2011/0265884 A1 | 11/2011 | Xu et al. | |
| 2011/0265951 A1 | 11/2011 | Xu et al. | |
| 2011/0266256 A1 | 11/2011 | Cruse et al. | |
| 2012/0046774 A1 | 2/2012 | Nakamura et al. | |
| 2012/0328780 A1 | 12/2012 | Yamagishi | |
| 2014/0033978 A1 | 2/2014 | Adachi et al. | |
| 2015/0093913 A1* | 4/2015 | Toyoda | C23C 16/45557 438/769 |
| 2015/0267297 A1 | 9/2015 | Shiba et al. | |

FOREIGN PATENT DOCUMENTS

| | | |
|---|---|---|
| JP | 2015-143383 A | 6/2015 |
| KP | 20-0264228 B1 | 2/2002 |
| KR | 10-2014-0018793 A | 2/2014 |

\* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This U.S. non-provisional patent application is a division of U.S. patent application Ser. No. 14/861,658 and claims priority under 35 U.S.C. § 119 of Japanese Patent Application No. 2015-167859, filed on Aug. 27, 2015 in the Japanese Patent Office, the entire contents of which are hereby incorporated by reference.

BACKGROUND

1. Field

The present invention relates to a substrate processing apparatus, a method of manufacturing a semiconductor device and a non-transitory computer-readable recording medium.

2. Description of the Related Art

In recent, semiconductor devices have been manufactured with small sized lots and multiple types of products. When semiconductor devices are manufactured with the small sized lots and multiple types of products, the improvement of productivity is required. As one of methods that satisfy the above-described requirement, there is a method in which the productivity is improved using a single wafer apparatus including a plurality of process chambers.

SUMMARY

There is a challenge in that productivity is reduced by the mismatch between the number of process chambers provided in a processing apparatus and the number of process sheets.

The present invention provides a technique capable of improving the productivity of a processing apparatus including a plurality of process chambers.

According to an aspect of the present invention, there is provided a technique including: a plurality of process chambers where substrates are processed; a process gas supply unit configured to supply a process gas into each of the plurality of process chambers; a purge gas supply unit configured to supply a purge gas into each of the plurality of process chambers; an exhaust unit configured to exhaust each of the plurality of process chambers; and a control unit configured to control the process gas supply unit, the purge gas supply unit and the exhaust unit to supply the process gas into a first process chamber of the plurality of process chambers to which a substrate is transferred while supplying the purge gas into process chambers other than the first process chamber and exhausting the plurality of process chambers.

DETAILED DESCRIPTION OF THE PREFERRED EMBODIMENTS

<First Embodiment>

Hereinafter, a first embodiment of the present invention will be described with reference to the drawings.

Hereinafter, a substrate processing system according to the present embodiment will be described.

(1) Configuration of Substrate Processing System

Figure 1:
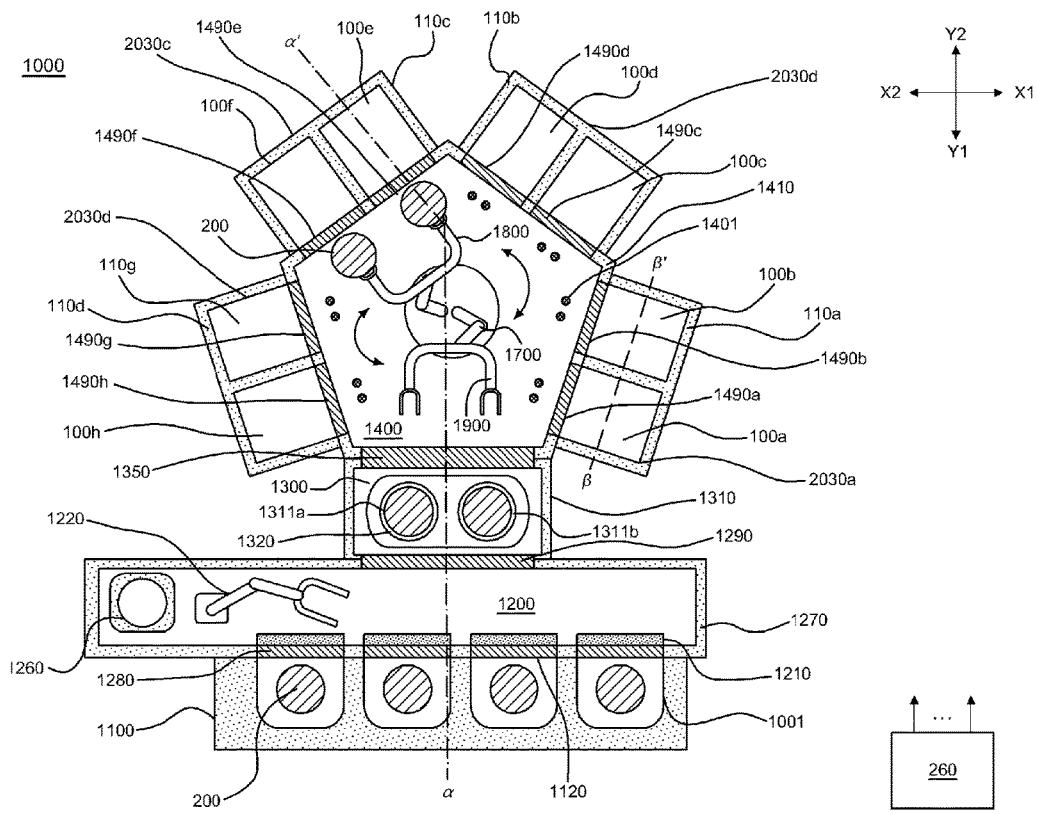
FIG. 1 is a cross-sectional schematic view of a substrate processing system according to an embodiment of the present invention.
Figure 2:
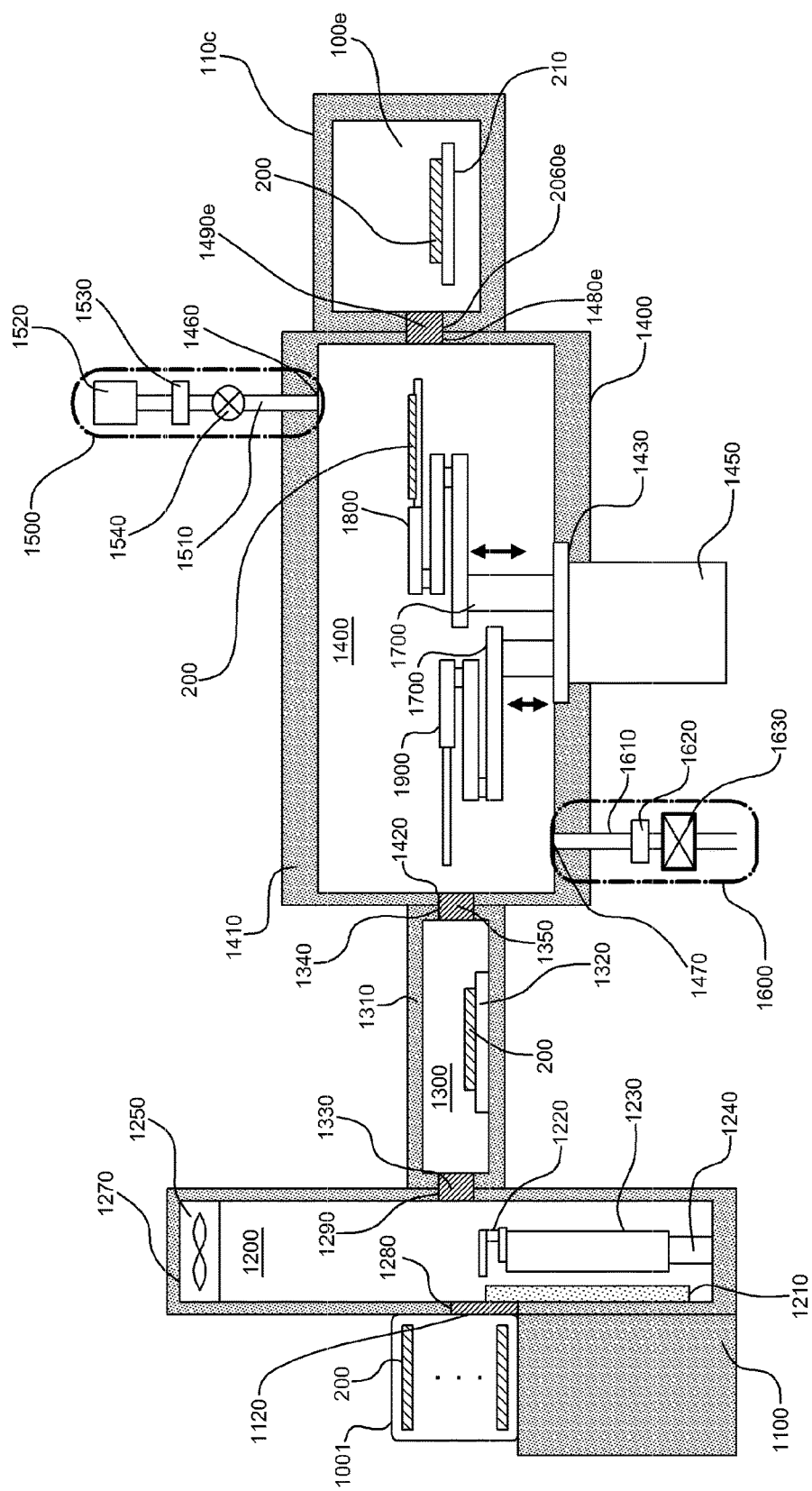
FIG. 2 is a vertical cross-sectional schematic view of the substrate processing system according to an embodiment of the present invention.
Figure 3:
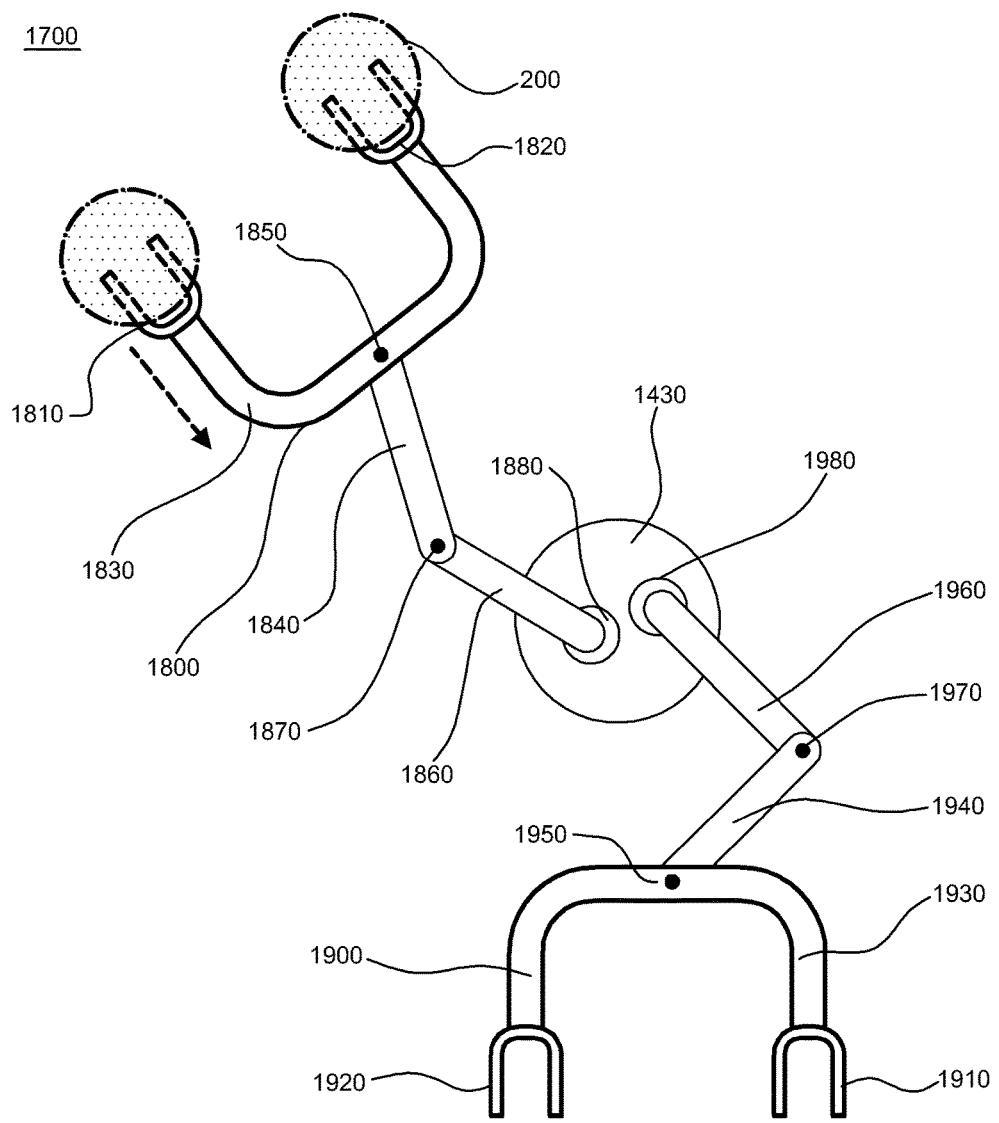
FIG. 3 is a schematic view of a vacuum transfer robot of the substrate processing system according to an embodiment of the present invention.
Figure 4:
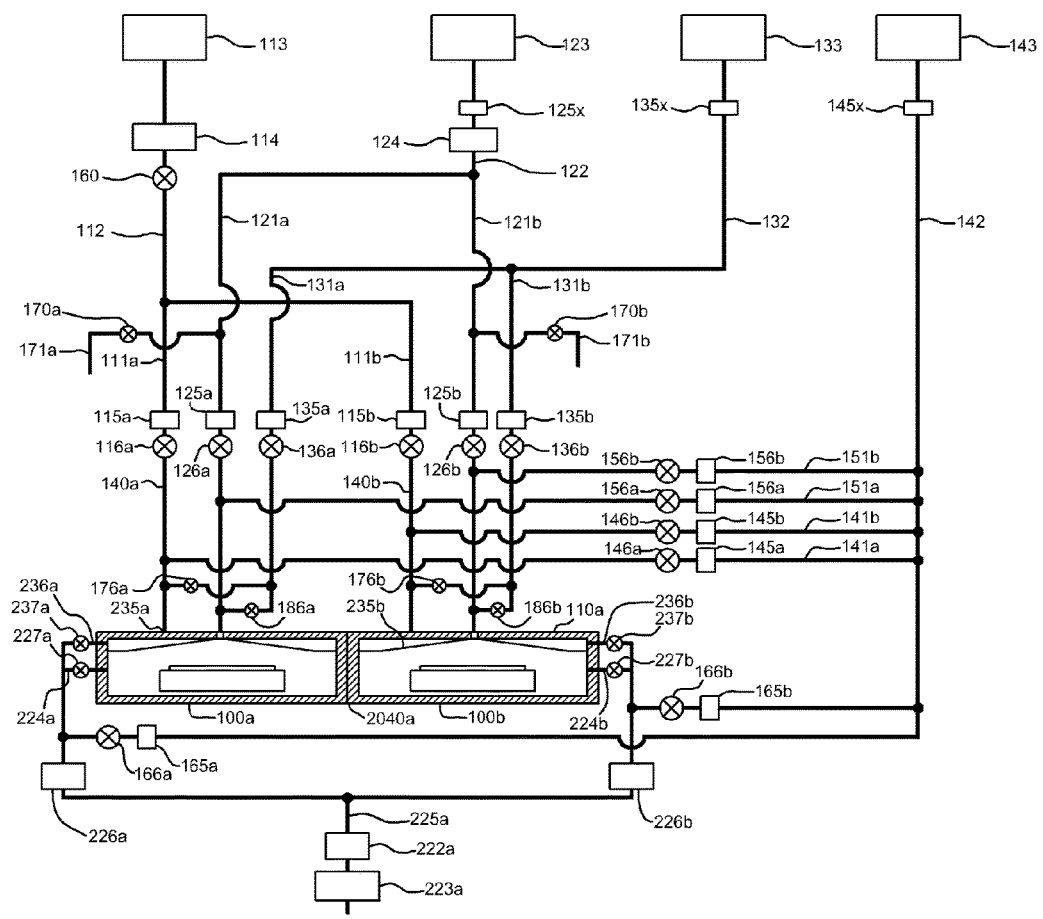
FIG. 4 is a configuration diagram schematically illustrating a substrate processing apparatus according to an embodiment of the present invention.
Figure 5:
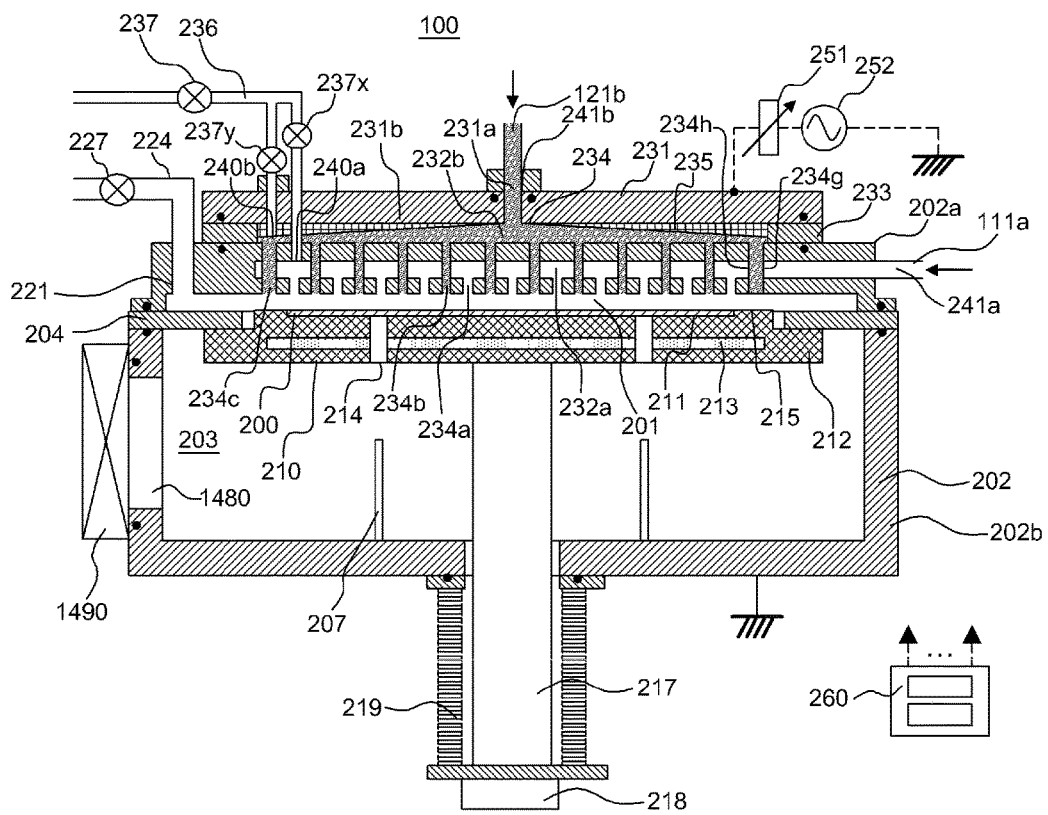
FIG. 5 is a vertical cross-sectional schematic view of a chamber according to an embodiment of the present invention.

A configuration of a substrate processing system according to an embodiment of the present invention will be described with reference to FIGS. 1 through 4. FIG. 1 is a cross-sectional view illustrating the configuration of the substrate processing system according to the present embodiment. FIG. 2 is a vertical cross-sectional view taken along line α-α' of FIG. 1 that illustrates the configuration of the substrate processing system according to the present embodiment. FIG. 3 is an explanatory diagram for describing in detail an arm of FIG. 1. FIG. 4 is a vertical cross-sectional view taken along line β-β' of FIG. 1 and an explanatory diagram for describing a gas supply system that supplies a gas to a process module. FIG. 5 is an explanatory diagram for describing a chamber provided in the process module.

In FIGS. 1 and 2, a substrate processing system 1000 to which the present invention is applied performs processing on wafers 200 and mainly includes an IO stage 1100, an atmosphere transfer chamber 1200, a load lock chamber 1300, a vacuum transfer chamber 1400 and process modules 110. Next, each of the components will be described in detail. In front, rear, left and right of the description of FIG. 1, a direction of X1 is defined as the right, a direction of X2 as the left, a direction of Y1 as the front and a direction of Y2 as the rear in FIG. 1. Also, a semiconductor device is formed on a surface of the wafer 200 and one process of manufacturing the semiconductor device is performed in the substrate processing system 1000. Here, the semiconductor device includes at least one of integrated circuits (ICs) and electronic elements (resistance elements, coil elements, capacitor elements and semiconductor devices). Also, the semiconductor device may include a dummy film required during the manufacture of the semiconductor device.

[Atmosphere Transfer Chamber and IO Stage]

The IO stage 1100 (load port) is provided in front of the substrate processing system 1000. A plurality of pods 1001 are mounted on the IO stage 1100. The pod 1001 is used as a carrier that transfers the substrate 200 such as a silicon (Si) substrate or the like and is configured to store a plurality of unprocessed substrates 200 or processed substrates 200 in a horizontal posture.

Caps 1120 are provided in the pods 1001 and are opened and closed by pod openers 1210 to be described. When the pod opener 1210 opens or closes the cap 1120 of the pod 1001 placed on the IO stage 1100 and opens or closes a substrate loading and unloading port, the substrate 200 may be loaded or unloaded into or from the pod 1001. The pod 1001 is supplied or discharged to or from the IO stage 1100 by an in-process transfer device (such as RGV) (not illustrated).

The IO stage 1100 is adjacent to the atmosphere transfer chamber 1200. The load lock chamber 1300 to be described is connected to a surface of the atmosphere transfer chamber 1200, which is opposite to the IO stage 1100.

An atmosphere transfer robot 1220 serving as a first transfer robot that transfers the substrate 200 is provided in the atmosphere transfer chamber 1200. As illustrated in FIG. 2, the atmosphere transfer robot 1220 is configured to be lifted by an elevator 1230 provided in the atmosphere transfer chamber 1200 and is configured to laterally reciprocate by a linear actuator 1240.

As illustrated in FIG. 2, a clean unit 1250 that supplies clean air is provided on an upper portion of the atmosphere transfer chamber 1200. Also, as illustrated in FIG. 1, a notch or orientation flat aligning device (hereinafter, referred to as a pre-aligner) 1260, which is formed on the substrate 200, is provided at a left side of the atmosphere transfer chamber 1200.

As illustrated in FIGS. 1 and 2, at a front side of a housing 1270 of the atmosphere transfer chamber 1200, a substrate loading and unloading port 1280 that loads or unloads the substrate 200 into or from the atmosphere transfer chamber 1200 and the pod opener 1210 are provided. At a side opposite to the pod opener 1210, that is, at an outer side of the housing 1270, the IO stage 1100 (load port) is provided with the substrate loading and unloading port 1280 therebetween.

At a rear side of the housing 1270 of the atmosphere transfer chamber 1200, a substrate loading and unloading port 1290 that loads or unloads the wafer 200 into or from the load lock chamber 1300 is provided. When the substrate loading and unloading port 1290 is opened or closed by a gate valve 1330, the wafer 200 may be loaded or unloaded.

[Load Lock (L/L) Chamber]

The load lock chamber 1300 is adjacent to the atmosphere transfer chamber 1200. As described below, the vacuum transfer chamber 1400 is disposed on a surface opposite to the atmosphere transfer chamber 1200 among surfaces of a housing 1310 constituting the load lock chamber 1300. Since an inner pressure of the housing 1310 is changed according to an inner pressure of the atmosphere transfer chamber 1200 and an inner pressure of the vacuum transfer chamber 1400, the load lock chamber 1300 is configured to have a structure that can withstand a negative pressure.

A substrate loading and unloading port 1340 is provided at a side adjacent to the vacuum transfer chamber 1400 among sides of the housing 1310. When the substrate loading and unloading port 1340 is opened or closed by a gate valve 1350, the wafer 200 may be loaded or unloaded.

Also, a substrate placement unit 1320 including at least two substrate placement surfaces 1311 (1311*a* and 1311*b*) that place the wafer 200 is provided in the load lock chamber 1300. A distance between the substrate placement surfaces 1311 is set according to a distance between fingers included in a vacuum transfer robot 1700 to be described below.

[Vacuum Transfer Chamber]

The substrate processing system 1000 includes the vacuum transfer chamber 1400 (transfer module) serving as a transfer chamber which is a transfer space in which the substrate 200 is transferred under a negative pressure. A housing 1410 constituting the vacuum transfer chamber 1400 is formed to have a pentagonal shape in a plan view, and the load lock chamber 1300 and process modules 110*a* through 110*d* in which the wafers 200 are processed are connected to each of sides of the pentagon. The vacuum transfer robot 1700 serving as a second transfer robot that transfers the substrate 200 under a negative pressure is provided at a center portion of the vacuum transfer chamber 1400 using a flange 1430 as a base. Also, here, although the vacuum transfer chamber 1400 has a pentagonal shape as an example, it may have a polygonal shape such as a rectangular shape or a hexagonal shape.

A substrate loading and unloading port 1420 is provided at a sidewall adjacent to the load lock chamber 1300 among sidewalls of the housing 1410. When the substrate loading and unloading port 1420 is opened or closed by the gate valve 1350, the wafer 200 may be loaded or unloaded.

As illustrated in FIG. 2, the vacuum transfer robot 1700 provided in the vacuum transfer chamber 1400 is configured to perform lifting by an elevator 1450 and the flange 1430 while airtightness of the vacuum transfer chamber 1400 is maintained. A configuration of the vacuum transfer robot 1700 will be described in detail below. The elevator 1450 is configured to individually lift two arms 1800 and 1900 included in the vacuum transfer robot 1700.

An inert gas supply hole 1460 that supplies an inert gas into the housing 1410 is provided at a ceiling portion of the housing 1410. An inert gas supply pipe 1510 is provided in the inert gas supply hole 1460. In the inert gas supply pipe 1510, in order from an upstream end, an inert gas source 1520, a mass flow controller 1530 and a valve 1540 are provided to control an amount of inert gas supplied into the housing 1410.

An inert gas supply unit 1500 in the vacuum transfer chamber 1400 mainly includes the inert gas supply pipe 1510, the mass flow controller 1530 and the valve 1540. Also, the inert gas source 1520 and the inert gas supply hole 1460 may be included in the inert gas supply unit 1500.

An exhaust hole 1470 that exhausts the atmosphere of the housing 1410 is provided at a bottom wall of the housing 1410. An exhaust pipe 1610 is provided in the exhaust hole 1470. In the exhaust pipe 1610, in order from an upstream end, an auto pressure controller (APC) 1620 which is a pressure controller and a pump 1630 are provided.

A gas exhaust unit 1600 in the vacuum transfer chamber 1400 mainly includes the exhaust pipe 1610 and the APC 1620. Also, the pump 1630 and the exhaust hole 1470 may be included in the gas exhaust unit 1600.

The atmosphere of the vacuum transfer chamber 1400 is controlled by the collaboration of the inert gas supply unit 1500 and the gas exhaust unit 1600. For example, an inner pressure of the housing 1410 is controlled.

As illustrated in FIG. 1, among five sidewalls of the housing 1410, at the sidewalls in which the load lock chamber 1300 is not provided, the process modules 110a, 110b, 110c and 110d that perform desired processes on the wafers 200 are provided.

Chambers 100 are provided in each of the process modules 110a, 110b, 110c and 110d. Specifically, chambers 100a and 100b are provided in the process module 110a. Chambers 100c and 100d are provided in the process module 110b. Chambers 100e and 100f are provided in the process module 110c. Chambers 100g and 100h are provided in the process module 110d.

Among the sidewalls of the housing 1410, at the sidewalls facing the chambers 100, substrate loading and unloading ports 1480 are provided. For example, as illustrated in FIG. 2, at a sidewall facing the chamber 100e, a substrate loading and unloading port 1480e is provided.

In FIG. 2, when the chamber 100e is replaced by the chamber 100a, at a sidewall facing the chamber 100a, a substrate loading and unloading port 1480a is provided.

In the same manner, when the chamber 100f is replaced by the chamber 100b, at a sidewall facing the chamber 100b, a substrate loading and unloading port 1480b is provided.

As illustrated in FIG. 1, gate valves 1490 are provided in each of process chambers. Specifically, a gate valve 1490a is provided between the chamber 100a and the vacuum transfer chamber 1400 and a gate valve 1490b is provided between the chamber 100b and the vacuum transfer chamber 1400. A gate valve 1490c is provided between the chamber 100c and the vacuum transfer chamber 1400 and a gate valve 1490d is provided between the chamber 100d and the vacuum transfer chamber 1400. A gate valve 1490e is provided between the chamber 100e and the vacuum transfer chamber 1400 and a gate valve 1490f is provided between the chamber 100f and the vacuum transfer chamber 1400. A gate valve 1490g is provided between the chamber 100g and the vacuum transfer chamber 1400 and a gate valve 1490h is provided between the chamber 100h and the vacuum transfer chamber 1400.

When each of the gate valves 1490 is opened or closed, the wafer 200 may be loaded or unloaded through the substrate loading and unloading port 1480.

Next, the vacuum transfer robot 1700 mounted in the vacuum transfer chamber 1400 will be described with reference to FIG. 3. FIG. 3 is an enlarged view of the vacuum transfer robot 1700 of FIG. 1.

The vacuum transfer robot 1700 includes two arms including an arm 1800 and an arm 1900. The arm 1800 includes a fork portion 1830 in which two end effectors including an end effector 1810 and an end effector 1820 are provided at tips thereof. A middle portion 1840 is connected to a center of the fork portion 1830 through a shaft 1850.

The wafers 200 unloaded from each of the process modules 110 are placed on the end effector 1810 and the end effector 1820. In FIG. 2, a case in which the wafer 200 unloaded from the process module 110c is placed, is illustrated as an example.

A bottom portion 1860 is connected to a portion opposite to the fork portion 1830 among portions of the middle portion 1840 through a shaft 1870. The bottom portion 1860 is disposed on the flange 1430 through a shaft 1880.

The arm 1900 includes a fork portion 1930 in which two end effectors including an end effector 1910 and end effector 1920 are provided at tips thereof. A middle portion 1940 is connected to a center of the fork portion 1930 through a shaft 1950.

The wafers 200 unloaded from the load lock chamber 1300 are placed on the end effector 1910 and the end effector 1920.

A bottom portion 1960 is connected to a portion opposite to the fork portion 1930 among portions of the middle portion 1940 through a shaft 1970. The bottom portion 1960 is disposed on the flange 1430 through a shaft 1980.

The end effector 1810 and the end effector 1820 are disposed at a higher level than the end effector 1910 and the end effector 1920.

The vacuum transfer robot 1700 may rotate based on the shafts and extend the arms.

[Process Modules]

Next, the process module 110a in the process module 110 will be described with reference to FIGS. 1, 2 and 4 as an example. FIG. 4 is an explanatory diagram for describing the process module 110a, a gas supply unit connected to the process module 110a and a gas exhaust unit connected to the process module 110a.

Here, although the process module 110a is used as an example, the other process modules including the process module 110b, the process module 110c and the process module 110d have the same structure and thus, descriptions thereof will be omitted herein.

As illustrated in FIG. 4, the chamber 100a and the chamber 100b, in which the wafer 200 is processed, are provided in the process module 110a. A partition 2040a is provided between the chamber 100a and the chamber 100b and is configured so that the atmospheres in the chambers are not mixed.

In the same manner as the chamber 100e illustrated in FIG. 2, a substrate loading and unloading port 2060e is provided at a wall adjacent to the chamber 100e and the vacuum transfer chamber 1400. A substrate loading and unloading port 2060a is provided at a wall adjacent to the chamber 100a and the vacuum transfer chamber 1400.

A substrate support unit 210 that supports the wafer 200 is provided in each chamber 100.

A gas supply unit that supplies a process gas into each of the chamber 100a and the chamber 100b is connected to the process module 110a. The gas supply unit includes a first gas supply unit (process gas supply unit), a second gas supply unit (reactive gas supply unit), a third gas supply unit (first purge gas supply unit) and a fourth gas supply unit (second purge gas supply unit). Each of components of the gas supply system will be described.

[First Gas Supply Unit]

As illustrated in FIG. 4, a buffer tank 114, MFCs 115a and 115b and process chamber side valves 116 (116a and 116b) are provided between a process gas source 113 and the process module 110a. Also, these components are connected to each other through a process gas common pipe 112 or process gas supply pipes 111a and 111b. The first gas supply unit includes the process gas common pipe 112, the MFCs 115a and 115b, the process chamber side valves 116 (116a and 116b) and the first gas supply pipes (process gas supply pipes) 111a and 111b. Also, the process gas source 113 may be included in the first gas supply system. Also, according to the number of the process modules provided in the substrate processing system, the same component may be added or removed.

Here, the MFC may be a flow control device configured to combine the electrical flow meter and the flow control and a flow control device such as a needle valve or orifice. The MFC to be described blow may be configured in the same manner. When the MFC includes the flow control device such as a needle valve or orifice, the gas supply is easily switched at a high speed in a pulsed manner.

[Second Gas Supply Unit]

As illustrated in FIG. 4, a remote plasma unit (RPU) 124 serving as an activation unit, MFCs 125a and 125b and process chamber side valves 126 (126a and 126b) are provided between a reactive gas supply source 123 and the process module 110a. These components are connected to each other through a reactive gas common pipe 122 or second gas supply pipes (reactive gas supply pipes) 121a and 121b. The second gas supply unit includes the RPU 124, the MFCs 125a and 125b, the process chamber side valves 126 (126a and 126b), the reactive gas common pipe 122 and the reactive gas supply pipes 121a and 121b. Also, the reactive gas supply source 123 may be included in the second gas supply unit. Also, according to the number of the process modules provided in the substrate processing system, the same component may be added or removed.

Also, vent lines 171a and 171b and vent valves 170 (170a and 170b) may be provided in front of the process chamber side valves 126 (126a and 126b) and may be configured to exhaust a reactive gas. When the vent lines are provided, a deactivated reactive gas or a reactive gas having reduced reactivity may be discharged without passing the process chamber.

[Third Gas Supply Unit (First Purge Gas Supply Unit)]

As illustrated in FIG. 4, MFCs 135a and 135b, process chamber side valves 136 (136a and 136b) and valves 176a, 176b, 186a and 186b are provided between a first purge gas (inert gas) source 133 and the process module 110a. These components are connected to each other through a purge gas (inert gas) common pipe 132 or purge gas (inert gas) supply pipes 131a and 131b. The third gas supply system includes the MFCs 135a and 135b, the process chamber side valves 136 (136a and 136b), the inert gas common pipe 132 and the inert gas supply pipes 131a and 131b. Also, the purge gas (the inert gas) source 133 may be included in the third gas supply unit (first purge gas supply unit). Also, according to the number of the process modules provided in the substrate processing system, the same component may be added or removed.

[Fourth Gas Supply Unit (Second Purge Gas Supply Unit)]

As illustrated in FIG. 4, the fourth gas supply unit is configured to supply an inert gas to the process chambers 110a and 110b through the process gas supply pipes 111a and 111b and the reactive gas supply pipes 121a and 121b. Fourth purge gas supply pipes 141a, 141b, 151a and 151b, MFCs 145a, 145b, 155a and 155b and valves 146a, 146b, 156a and 156b are provided between a second purge gas (the inert gas) source 143 and the supply pipes. The fourth gas supply unit (second purge gas supply unit) includes these components. Also, although the gas sources of the third gas supply unit and the fourth gas supply unit are separately configured herein, only one integrated gas source may be provided.

Also, a gas exhaust unit that exhausts the atmospheres in the chamber 100a and the chamber 100b is connected to the process module 110a. As illustrated in FIG. 4, an APC 222a, a common gas exhaust pipe 225a and process chamber exhaust pipes 224a and 224b are provided between an exhaust pump 223a and the chambers 100a and 100b. The gas exhaust unit includes the APC 222a, the supply gas exhaust pipe 225a and the process chamber exhaust pipes 224a and 224b. The atmospheres in the chamber 100a and the chamber 100b are configured to be exhausted by a single exhaust pump. Also, conductance adjusters 226a and 226b that adjust exhaustion conductance of each of the process chamber exhaust pipes 224a and 224b may be provided and may be configured to provide as a component of the gas exhaust unit. Also, the exhaust pump 223a may be configured to provide as a component of the gas exhaust unit.

Next, the chamber 100 according to the present embodiment will be described. The chamber 100 is configured as a single wafer substrate processing apparatus as illustrated in FIG. 5. In the chamber 100, one process of manufacturing the semiconductor device is performed. Also, the chambers 100a, 100b, 100c, 100d, 100e, 100f, 100g and 100h are configured to have the same configuration as illustrated in FIG. 5. Here, the chamber 100a will be described as an example.

As illustrated in FIG. 5, the chamber 100 includes a process container 202. The process container 202 has, for example, a circular cross-section and is configured as a planar closed container. Also, the process container 202 is made of a metal material such as aluminum (Al) or stainless steel (SUS) or quartz. A process space (process chamber) 201 and a transfer space 203 in which the wafer 200 such as a silicon wafer serving as a substrate is processed are formed in the process container 202. The process container 202 includes an upper container 202a and a lower container 202b. A partition plate 204 is provided between the upper container 202a and the lower container 202b. A space which is surrounded by the upper container 202a and located above the partition plate 204 is referred to as the process space (process chamber) 201 and a space that is surrounded by the lower container 202b and located under the partition plate 204 is referred to as a transfer space.

The substrate loading and unloading port 1480 adjacent to the gate valve 1490 is provided on a side surface of the lower container 202b and the wafer 200 moves between the substrate loading and unloading port 1480 and a transfer chamber (not illustrated) through the substrate loading and unloading port 1480. A plurality of lift pins 207 are provided on a bottom portion of the lower container 202b. Also, the lower container 202b is grounded.

The substrate support unit 210 that supports the wafer 200 is provided in the process chamber 201. The substrate support unit 210 includes a placement surface 211 on which the wafer 200 is placed and a substrate placement unit 212 having the placement surface 211 on a surface thereof. Also, a heater 213 serving as a heating unit may be provided in the substrate support unit 210. When the heating unit is provided, the substrate is heated and thus, the quality of a film formed on the substrate may be improved. Through holes 214 through which the lift pins 207 are passed may be provided in the substrate placement unit 212 at positions corresponding to the lift pins 207.

The substrate placement unit 212 is supported by a shaft 217. The shaft 217 passes through a bottom portion of the process container 202 and is connected to a lifting mechanism 218 outside the process container 202. When the shaft 217 and the substrate placement unit 212 are lifted by operating the lifting mechanism 218, the wafer 200 placed on the substrate placement surface 211 may be lifted. Also, the vicinity of a lower end of the shaft 217 is covered by bellows 219 and thus, the process chamber 201 is airtightly maintained.

When the wafer 200 is transferred, the substrate placement unit 212 is lowered until the substrate placement surface 211 is moved at a position (wafer transfer position) of the substrate loading and unloading port 1480, and when the wafer 200 is processed, the substrate placement unit 212 is raised until the wafer 200 is moved at a position (wafer process position) of the process chamber 201 as illustrated in FIG. 5.

Specifically, when the substrate placement unit 212 is lowered at the wafer transfer position, an upper end of the lift pin 207 protrudes from an upper surface of the substrate placement surface 211 and thus, the lift pin 207 is configured to support the wafer 200 from a lower side. Also, when the substrate placement unit 212 is raised at the wafer process position, the lift pin 207 is buried from the upper surface of the substrate placement surface 211 and thus, the substrate placement surface 211 is configured to support the wafer 200 from a lower side. Also, since the lift pin 207 is directly in contact with the wafer 200, preferably, the lift pin 207 is formed of a material such as quartz or alumina. Also, the lift mechanism is provided in the lift pin 207 and thus, the substrate placement unit 212 and the lift pin 207 may be configured to relatively move.

[Exhaust System]

An exhaust port 221 serving as a first exhaust unit that exhausts the atmosphere of the process chamber 201 is provided on an inner wall of the process chamber 201 [upper container 202a]. A process chamber exhaust pipe 224 is connected to the exhaust port 221 and a valve 227 is sequentially connected thereto in series. The first exhaust unit (exhaust line) mainly includes the exhaust port 221, the process chamber exhaust pipe 224 and the valve 227. Also, a vacuum pump 223 may be included in the first exhaust unit.

[Gas Inlet]

A first gas inlet 241a for supplying various gases into the process chamber 201 is provided at a sidewall of the upper container 202a. The first gas supply pipe 111a is connected to the first gas inlet 241a. Also, a second gas inlet 241b for supplying various gases into the process chamber 201 is provided on an upper surface (ceiling wall) of a shower head 234 provided on an upper portion of the process chamber 201. The second gas supply pipe 121b is connected to the second gas inlet 241b. A configuration of each of gas supply units connected to the first gas inlet 241a configured as a part of the first gas supply unit and the second gas inlet 241b configured as a part of the second gas supply unit will be described below. Also, the first gas inlet 241a to which a first gas is supplied is provided on the upper surface (ceiling wall) of the shower head 234, and thus, the first gas may be supplied through a center of a first buffer space 232a. When the first gas is supplied through the center of the first buffer space 232a, the gas in the first buffer space 232a flows from a center thereof toward an outer circumference thereof, the gas in the space uniformly flows and thus, an amount of gas supplied to the wafer 200 may be uniformly maintained.

[Gas Distribution Unit]

The shower head 234 includes the first buffer chamber (space) 232a, first distribution holes 234a, a second buffer chamber (space) 232b and second distribution holes 234b. The shower head 234 is provided between the second gas inlet 241b and the process chamber 201. The first gas introduced through the first gas inlet 241a is supplied into the first buffer space 232a (first distribution unit) of the shower head 234. Also, the second gas inlet 241b is connected to a cover 231 of the shower head 234, and a second gas introduced through the second gas inlet 241b is supplied into the second buffer space 232b (second distribution unit) of the shower head 234 through a hole 231a provided in the cover 231. The shower head 234 is formed of a material such as quartz, alumina, stainless steel, aluminum or the like.

Also, the cover 231 of the shower head 234 is formed of a conductive metal, and may be used as an activation unit (excitation unit) for exciting a gas present in the first buffer space 232a, the second buffer space 232b or the process chamber 201. In this case, an insulating block 233 is provided between the cover 231 and the upper container 202a and thus, the cover 231 is insulated from the upper container 202a. A matching unit 251 and a high frequency power source 252 are connected to an electrode [cover 231] serving as the activation unit and the electrode [cover 231] may be configured to supply electromagnetic waves (radio frequency power or microwave).

A gas guide 235 that forms the flow of the second gas supplied to the second buffer space 232b may be provided. The gas guide 235 has a conical shape in which a diameter is increased toward a diameter direction of the wafer 200 about the hole 231a. A horizontal diameter of a lower end of the gas guide 235 is formed to further extend to an outer circumference than ends of the first distribution hole 234a and the second distribution hole 234b.

A shower head exhaust port 240a serving as a first shower head exhaust unit that exhausts the atmosphere of the first buffer space 232a is provided on an upper surface of an inner wall of the first buffer space 232a. A shower head exhaust pipe 236 is connected to the shower head exhaust port 240a, and a valve 237x and a valve 237 that controls the inside of the first buffer space 232a at a predetermined pressure are sequentially connected to the shower head exhaust pipe 236 in series. The first shower head exhaust unit mainly includes the shower head exhaust port 240a, the valve 237x and the shower head exhaust pipe 236.

A shower head exhaust port 240b serving as a second shower head exhaust unit that exhausts the atmosphere of the second buffer space 232b is provided on an upper surface of an inner wall of the second buffer space 232b. The shower head exhaust pipe 236 is connected to the shower head exhaust port 240b, and a valve 237y and the valve 237 that controls the inside of the second buffer space 232b at a predetermined pressure are sequentially connected to the shower head exhaust pipe 236 in series. The second shower head exhaust unit mainly includes the shower head exhaust port 240b, the valve 237y and the shower head exhaust pipe 236.

Next, a relationship between the first buffer space 232a serving as the first gas supply unit and the second buffer space 232b serving as the second gas supply unit will be described. A plurality of distribution holes 234a are formed to extend from the first buffer space 232a to the process chamber 201. A plurality of distribution holes 234b are formed to extend from the second buffer space 232b to the process chamber 201. The second buffer space 232b is provided above the first buffer space 232a. Thus, as illustrated in FIG. 5, the distribution holes (distribution pipes) 234b are formed to pass through the first buffer space 232a from the second buffer space 232b and extend to the process chamber 201.

[Supply System]

A gas supply unit is connected to a gas introducing hole 241 connected to the cover 231 of the shower head 234. A process gas, a reactive gas and a purge gas are supplied through the gas supply unit.

[Control Unit]

As illustrated in FIG. 5, the chamber 100 includes a controller 260 that controls operations of each unit of the chamber 100.

Figure 6:
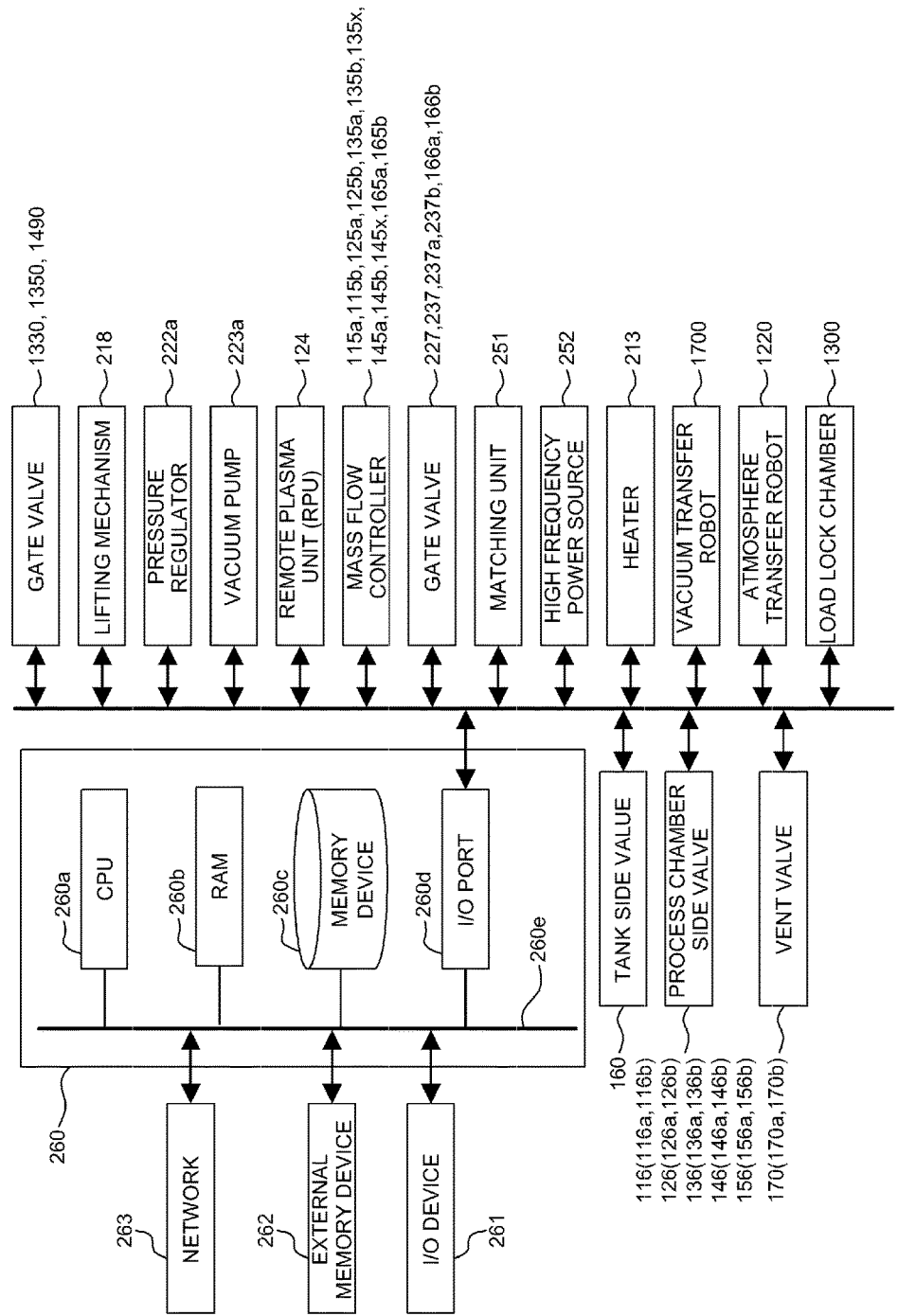
FIG. 6 is a configuration diagram schematically illustrating a controller of the substrate processing system according to an embodiment of the present invention.

The controller 260 is schematically illustrated in FIG. 6. The controller 260 serving as a control unit (control device)

is configured as a computer that includes a central processing unit (CPU) 260a, a random access memory (RAM) 260b, a memory device 260c and an I/O port 260d. The RAM 260b, the memory device 260c and the I/O port 260d are configured to exchange data with the CPU 260a through an internal bus 260e. An I/O device 261 configured as, for example, a touch panel or an external memory device 262 is connected to the controller 260.

The memory device 260c is configured as, for example, a flash memory and a hard disk drive (HDD). A control program controlling operations of the substrate processing apparatus or a process recipe describing sequences or conditions of substrate processing to be described below are readably stored in the memory device 260c. Also, the process recipe, which is a combination of sequences, causes the controller 260 to execute each sequence in a substrate processing process to be described below in order to obtain a predetermined result, and functions as a program. Hereinafter, such a program recipe, a control program and the like are collectively simply called a "program." Also, when the term "program" is used in this specification, it may refer to either the program recipe or the control program or both thereof. Also, the RAM 260b is configured as a memory area (work area) in which a program, data and the like read by the CPU 260a are temporarily maintained.

The I/O port 260d is connected to the gate valves 1330, 1350 and 1490, the lifting mechanism 218, the heater 213, pressure adjusters 222 and 238, the vacuum pump 223, the matching unit 251, the high frequency power source 252 and the like. Also, the I/O port 260d may be connected to a transfer robot 105, an atmosphere transfer unit 102, a load lock unit 103, MFCs [115 (115a and 115b), 125 (125a, 125b and 125x), 135 (135a, 135b and 135x), 145 (145a, 145b and 145x), 155 (155a and 155b) and 165 (165a and 165b)], valves 237 (237e and 237f), process chamber side valves [116 (116a and 116b), 126 (126a and 126b), 136 (136a and 136b), 176 (176a and 176b) and 186 (186a and 186b)], a tank side valve 160, vent valves 170 (170a and 170b), the RPU 124 and the like to be described below.

The CPU 260a reads and executes the control program from the memory device 260c and reads the process recipe from the memory device 260c according to an input of a manipulating command from the I/O device 261. Also, to comply with the content of the read process recipe, the CPU 260a is configured to control an open or close operation of a gate valve 1330, 1350, 1490 (1490a, 1490b, 1490c, 1490d, 1490e, 1490f, 1490g and 1490h), a lifting operation of the lifting mechanism 218, a power supply operation to the heater 213, a pressure adjusting operation by the pressure adjusters [222 (222a) and 238], an ON/OFF control by the vacuum pump 223, a gas activation operation of the RPU 124, a flow rate adjusting operation by the MFCs [115 (115a and 115b), 125 (125a and 125b) and 135 (135a and 135b)], an ON/OFF control of the gas by the valves 237 (237e and 237f), the process chamber side valves [116 (116a and 116b), 126 (126a, 126b, 126c and 126d), 136 (136a and 136b), 176 (176a and 176b) and 186 (186a and 186b)], the tank side valve 160 and the vent valves 170 (170a and 170b), a matching operation of the power by the matching unit 251, an ON/OFF control by the high frequency power source 252 and the like.

Also, the controller 260 is not limited to being configured as a dedicated computer, but may be configured as a general-purpose computer. For example, the controller 260 according to the present embodiment may be configured by preparing an external memory device 262 [for example, a magnetic tape, a magnetic disk such as a flexible disk and a hard disk, an optical disc such as a CD or a DVD, a magneto-optical disc such as an MO and a semiconductor memory such as a USB memory and a memory card] recording the above-described program and then installing the program in the general-purpose computer using the external memory device 262. Also, a method of supplying the program to the computer is not limited to supplying through the external memory device 262. For example, a communication line such as a network 263 (the Internet or an exclusive line) may be used to supply the program without the external memory device 262. Also, the memory device 260c or the external memory device 262 is configured as a non-transitory computer-readable recording medium. Hereinafter, these are also collectively simply called a recording medium. Also, when the term "recording medium" is used in this specification, it refers to either the memory device 260c or the external memory device 262 or both thereof.

(2) First Substrate Processing Process

Next, using a processing furnace of the above-described substrate processing apparatus, sequences of forming an insulating film, for example, a silicon oxide (SiO) film serving as a silicon-containing film on a substrate as a method of manufacturing the semiconductor apparatus (semiconductor device) will be described with reference to FIGS. 7 and 8. Also, in the following description, operations of each unit of the substrate processing apparatus are controlled by the controller 260.

When the term "wafer" is used in this specification, it refers to "the wafer itself," or a "laminate (aggregate) of a wafer, a predetermined layer, film and the like formed on a surface thereof," that is, the wafer refers to a wafer including a predetermined layer, film and the like formed on a surface thereof. In addition, when the term "surface of the wafer" is used in this specification, it refers to "a surface (exposed surface) of the wafer itself" or "a surface of a predetermined layer, film and the like formed on the wafer, that is, the outermost surface of the wafer as the laminate."

Therefore, when it is described in this specification that "a predetermined gas is supplied to the wafer," it means that "a predetermined gas is directly supplied to a surface (exposed surface) of the wafer itself" or "a predetermined gas is supplied to a layer, film and the like formed on the wafer, that is, to the outermost surface of the wafer as the laminate." In addition, when it is described in this specification that "a predetermined layer (or film) is formed on the wafer," it means that "a predetermined layer (or film) is directly formed on a surface (exposed surface) of the wafer itself" or "a predetermined layer (or film) is formed on a layer, film and the like formed on the wafer, that is, a predetermined layer (or film) is formed on the outermost surface of the wafer as the laminate."

Also, the terms "substrate" and "wafer" as used in this specification have the same meanings. Thus, the term "wafer" in the above description may be replaced with the term "substrate."

Hereinafter, a first substrate processing process (S200A) will be described.

[Substrate Loading Process (S201)]

In the first substrate processing process (S200A), first, the wafer 200 is loaded into the process chamber 201. Specifically, the substrate support unit 210 is lowered by the lifting mechanism 218 and the lift pin 207 protrudes from an upper surface of the substrate support unit 210 through the through hole 214. Also, after an inner pressure of the process chamber 201 is adjusted to have a predetermined pressure, the gate valve 1490 is opened and then the wafer 200 is placed on the lift pin 207 through the gate valve 1490. After the wafer 200 is placed on the lift pin 207, when the substrate support unit 210 is raised by the lifting mechanism 218 at a predetermined position, the wafer 200 is placed from the lift pin 207 to the substrate support unit 210.

[Pressure Decreasing and Temperature Rising Process (S202)]

Next, the process chamber 201 is exhausted through the process chamber exhaust pipe 224 so that the process chamber 201 has a predetermined pressure (degree of vacuum). In this case, a degree of opening of the APC valve serving as the pressure adjuster 222 (222a) is fed back and controlled based on a pressure value measured by a pressure sensor. Also, an amount of power supply of the heater 213 is fed back and controlled so that the process chamber 201 has a predetermined temperature based on a temperature value measured by a temperature sensor (not illustrate). Specifically, the substrate support unit 210 is pre-heated by the heater 213, a change of a temperature of the wafer 200 or the substrate support unit 210 is removed and then the substrate support unit 210 is placed for a predetermined time. During the time, when there is a remaining moisture in the process chamber 201 or a gas discharged from the component, the remaining moisture or the gas may be vacuum-exhausted or removed by purging by the supply of an $N_2$ gas. Through this, the preparation before the film forming process is completed. Also, when the process chamber 201 is exhausted at a predetermined pressure, the process chamber 201 may be vacuum-exhausted once or to a reachable degree of vacuum.

[Film Forming Process (S301A)]

Next, an example in which an SiO film is formed on the wafer 200 will be described. Detailed descriptions for the film forming process (S301A) will be described with reference to FIGS. 7 and 8.

Figure 7:
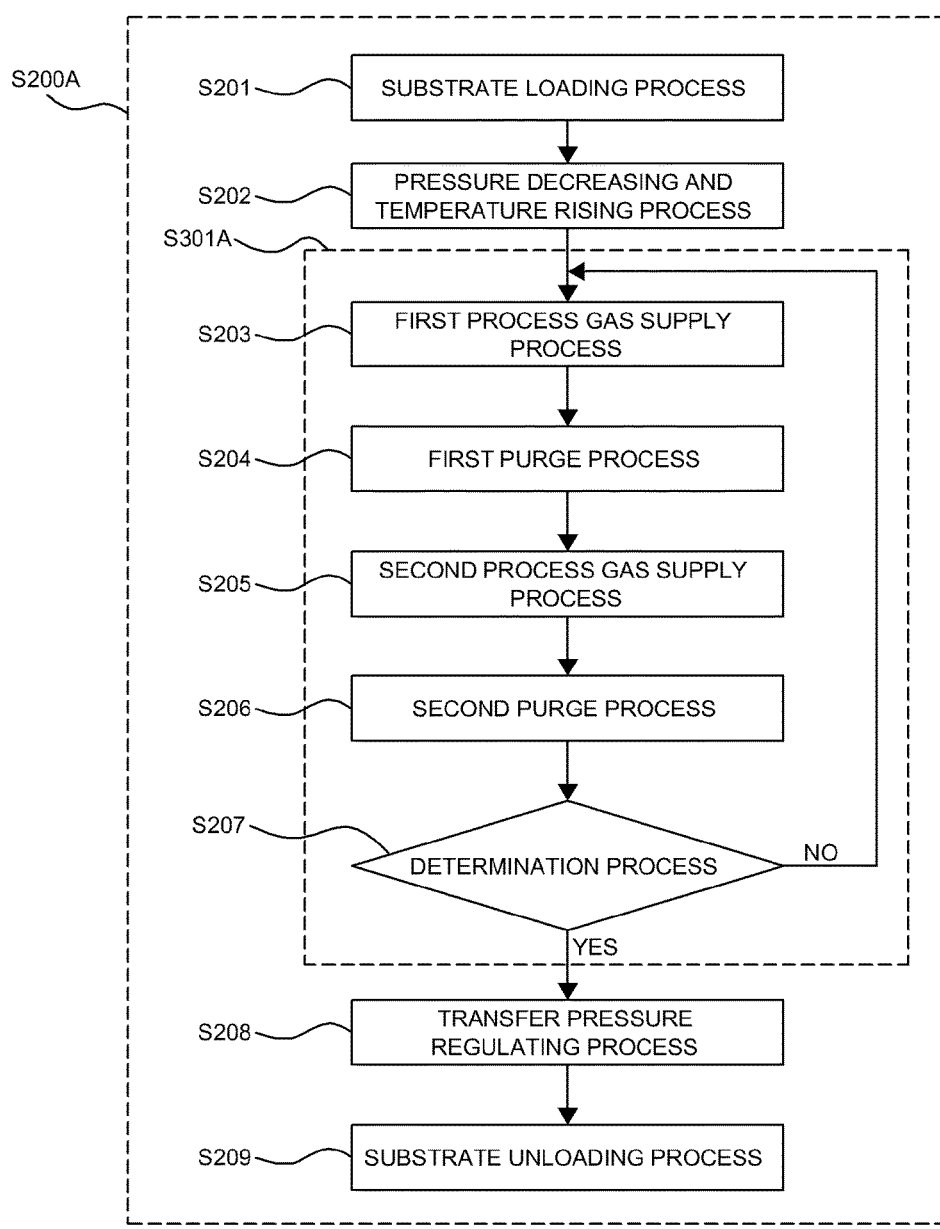
FIG. 7 is a flowchart for describing a first substrate processing process according to an embodiment of the present invention.
Figure 8:
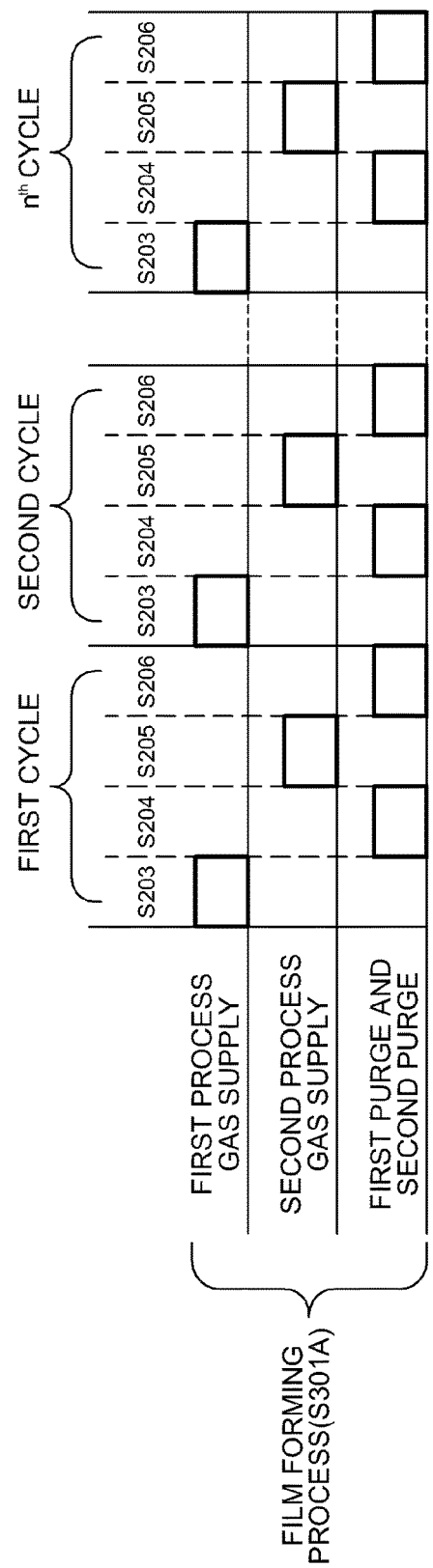
FIG. 8 is a sequence diagram for describing the first substrate processing process according to an embodiment of the present invention.

After the wafer 200 is placed on the substrate support unit 210 and the atmosphere in the process chamber 201 is stabilized, processes S203 through S207 illustrated in FIGS. 7 and 8 are performed.

[First Gas Supply Process (S203)]

In the first gas supply process (S203), an amino silane-based gas serving as a first gas (source gas) is supplied into the process chamber 201 of the first gas supply unit. The amino silane-based gas includes, for example, bis (diethylamino) silane (BDEAS) ($H_2Si(NEt_2)_2$). Specifically, the gas valve 160 is opened and the amino silane-based gas is supplied from the gas source to the chamber 100. In this case, the process chamber side valve 116a is opened and the amino silane-based gas is adjusted by the MFC 115a to have a predetermined flow rate. The amino silane-based gas having the adjusted flow rate passes through the first buffer space 232a and is supplied into the process chamber 201 in a decreased pressure state through the gas supply hole 234a of the shower head 234. Also, the process chamber 201 is continuously exhausted by the exhaust system and the inner pressure of the process chamber 201 is controlled to be within a predetermined pressure range (first pressure). In this case, the amino silane-based gas supplied to the wafer 200 is supplied into the process chamber 201 at a predetermined pressure (first pressure, for example, in a range of 100 Pa to 20,000 Pa). In the same manner, amino silane is supplied to the wafer 200. When the amino silane is supplied, a silicon-containing layer is formed on the wafer 200.

[First Purge Process (S204)]

After the silicon-containing layer is formed on the wafer 200, the gas valve 116a of the first gas supply pipe 111a is closed and the supply of the amino silane-based gas is stopped. As the supply of the source gas is stopped and the source gas present in the process chamber 201 or the source gas present in the first buffer space 232a is exhausted through the process chamber exhaust pipe 224, the first purge process (S204) is performed.

Also, in the purge process, it may be configured to perform a discharging process in which an inert gas is supplied and the residual gas is extruded in addition to the discharge of the gas by simply exhausting (vacuum suction) the gas. Also, a combination of the vacuum suction and the supply of the inert gas may be performed. Also, the vacuum suction and the supply of the inert gas may be alternately performed.

Also, in this case, the valve 237 of the shower head exhaust pipe 236 is opened and the gas present in the first buffer space 232a may be exhausted through the shower head exhaust pipe 236. Also, during the exhaustion, inner pressures (exhaustion conductance) of the shower head exhaust pipe 236 and the first buffer space 232a are controlled by the valve 227 and the valve 237. The valve 227 and the valve 237 may be controlled so that the exhaustion conductance through the shower head exhaust pipe 236 in the first buffer space 232a is greater than the exhaustion conductance to the process chamber exhaust pipe 224 through the process chamber 201. When the exhaustion conductance is controlled, a gas flow from the first gas inlet 241a which is an end of the first buffer space 232a toward the shower head exhaust port 240a which is another end thereof is formed. When the gas flow is formed, a gas attached to a wall of the first buffer space 232a or a gas floating in the first buffer space 232a is exhausted through the shower head exhaust pipe 236 without entering in the process chamber 201. Also, an inner pressure of the first buffer space 232a and an inner pressure (exhaustion conductance) of the process chamber 201 may be adjusted to suppress a reflux of the gas from the process chamber 201 to the first buffer space 232a.

Also, in the first purge process, the vacuum pump 223 continuously operates and the gas present in the process chamber 201 is exhausted through the vacuum pump 223. Also, the valve 227 and the valve 237 may be adjusted so that the exhaustion conductance from the process chamber 201 to the process chamber exhaust pipe 224 is greater than the exhaustion conductance to the first buffer space 232a. When the valve 227 and the valve 237 are adjusted, the gas flow toward the process chamber exhaust pipe 224 via the process chamber 201 is formed and the residual gas in the process chamber 201 may be exhausted. Also, here, when the valve 136a is opened, the MFC 135a is adjusted and the inert gas is supplied, the inert gas may be surely supplied to the substrate and thus, the removal efficiency of the residual gas on the substrate may be improved.

After a predetermined time has elapsed, the valve 136a is closed and the supply of the inert gas is stopped, and at the same time, the valve 237 is closed and a flow path from the first buffer space 232a to the shower head exhaust pipe 236 is blocked.

More preferably, after the predetermined time, the valve 237 is closed while the vacuum pump 223 continuously operates. In this manner, since the flow toward the process chamber exhaust pipe 224 via the process chamber 201 is not affected by the shower head exhaust pipe 236, it is possible to more reliably supply the inert gas onto the substrate and thus, the removal efficiency of the residual gas on the substrate may be further improved.

Also, purging of the atmosphere from the process chamber refers to an extrusion operation of the gas by supplying of the inert gas in addition to the discharging of the gas by simply vacuum suction. Therefore, in the first purge process, the inert gas is supplied into the first buffer space 232a and the discharging operation by the extrusion of the residual gas may be performed. Also, a combination of the vacuum suction and the supply of the inert gas may be performed. Also, the vacuum suction and the supply of the inert gas may be alternately performed.

Also, in this case, a high flow rate of an $N_2$ gas supplied into the process chamber 201 is not necessary, and for example, an amount of the $N_2$ gas as much as the volume of the process chamber 201 may be supplied. When the purge process is performed in this manner, an effect on a subsequent process may be reduced. Also, when the process chamber 201 is partially purged, the purge time may be reduced and the manufacturing throughput may be improved. Also, it is possible to suppress the consumption of the $N_2$ gas as much as possible.

In this case, a temperature of the heater 213 ranges from 200° C. to 750° C. which is the same as when the source gas is supplied to the wafer 200, preferably, from 300° C. to 600° C., and more preferably, from 300° C. to 550° C. A supply flow rate of the $N_2$ gas serving as the purge gas supplied through each inert gas supply system is, for example, ranging from 100 sccm to 20,000 sccm. A rare gas such as Ar, He, Ne, Xe or the like other than the $N_2$ gas serving as the purge gas may be used.

[Second Process Gas Supply Process (S205)]

After the first gas purge process, the valve 126 is opened and an oxygen-containing gas serving as a second gas (reactive gas) is supplied into the process chamber 201 through the gas introducing hole 241b, the second buffer space 232b and the plurality of distribution holes 234b. The oxygen-containing gas includes, for example, an oxygen ($O_2$) gas or ozone ($O_3$), water ($H_2O$), a nitrous oxide ($N_2O$) gas and the like. Here, an example using the $O_2$ gas is described. Since the $O_2$ gas is supplied into the process chamber 201 through the second buffer space 232b and the distribution hole 234b, the gas is uniformly supplied onto the substrate. Therefore, a film thickness may be uniformly formed. Also, when the second gas is supplied, the second gas activated through the RPU 124 serving as an activation unit (excitation unit) may be supplied into the process chamber 201.

In this case, the MFC 125 is controlled so that a flow rate of the $O_2$ gas is a predetermined flow rate. Also, a supply flow rate of the $O_2$ gas is, for example, in a range of 100 sccm to 10,000 sccm. Also, when the pressure adjuster 238 is appropriately adjusted, an inner pressure of the second buffer space 232b is within a predetermined pressure range. Also, when the $O_2$ gas flows into the RPU 124, the RPU 124 is in an ON state (a state in which power is turned on) and is controlled so that the $O_2$ gas is activated (excited).

When the $O_2$ gas is supplied to a silicon-containing layer formed on the wafer 200, the silicon-containing layer is modified. For example, silicon atoms or a modified layer containing silicon atoms is formed. Also, when the $O_2$ gas activated by providing the RPU 124 is supplied onto the wafer 200, a number of modified layers may be formed.

The modified layer is formed, for example, to have a predetermined thickness, a predetermined distribution and a predetermined penetration depth of an oxygen component with respect to the silicon-containing layer according to the inner pressure of the process chamber 201, the flow rate of the $O_2$ gas, the temperature of the wafer 200 and a power supply state of the RPU 124.

After a predetermined time has elapsed, the valve 126 is closed and the supply of the $O_2$ gas is stopped.

[Second Purge Process (S206)]

When the supply of the $O_2$ is stopped, the second purge process (S206) is performed by exhausting the $O_2$ gas present in the process chamber 201 or the $O_2$ gas present in the second buffer space 232b through the first exhaust unit. The second purge process (S206) is performed in the same manner as the above-described first purge process (S204).

In the second purge process (S206), the vacuum pump 223 continuously operates, and the gas present in the process chamber 201 is exhausted through the process chamber exhaust pipe 224. Also, the valve 227 and the valve 237 may be adjusted so that the exhaustion conductance from the process chamber 201 to the process chamber exhaust pipe 224 is greater than the exhaustion conductance to the second buffer space 232b. When the valve 227 and the valve 237 are adjusted, a gas flow toward the process chamber exhaust pipe 224 via the process chamber 201 is formed and the residual gas in the process chamber 201 may be exhausted. Also, here, when the gas valve 136b is opened, the MFC 135b is adjusted and the inert gas is supplied, it is possible to surely supply the inert gas onto the substrate and thus, the removal efficiency of the residual gas on the substrate may be further improved.

After a predetermined time has elapsed, the gas valve 136b is closed and the supply of the inert gas is stopped, and at the same time, the valve 237b is closed and a space between the second buffer space 232b and the shower head exhaust pipe 236 is blocked.

More preferably, after a predetermined time has elapsed, the valve 237b is closed while the vacuum pump 223 continuously operates. With this configuration, since the flow toward the shower head exhaust pipe 236 via the process chamber 201 is not affected by the process chamber exhaust pipe 224, the inert gas may be surely supplied onto the substrate and thus, the removal efficiency of the residual gas on the substrate may be further improved.

Also, purging the atmosphere from the process chamber refers to an extrusion operation of the gas by supplying of the inert gas in addition to the discharging of the gas by simply vacuum suction. Therefore, in the purge process, the inert gas is supplied into the second buffer space 232b and the discharging operation by the extrusion of the residual gas may be performed. Also, a combination of the vacuum suction and the supply of the inert gas may be performed. Also, the vacuum suction and the supply of the inert gas may be alternately performed.

Also, in this case, a high flow rate of an $N_2$ gas supplied into the process chamber 201 is unnecessary, and for example, an amount of $N_2$ gas as much as the volume of the process chamber 201 may be supplied. When the purge process is performed in this manner, an effect on the subsequent process may be reduced. Also, when the process chamber 201 is partially purged, the purge time may be reduced and thus, the manufacturing throughput may be improved. Also, it is possible to suppress the consumption of the $N_2$ gas as much as possible.

In this case, a temperature of the heater 213 ranges from ranging from 200° C. to 750° C., which is the same as when a source gas is supplied to the wafer 200, preferably, from 300° C. to 600° C., and more preferably, from 300° C. to 550° C. A supply flow rate of an $N_2$ gas serving as a purge gas supplied through each inert gas supply system is, for example, ranging from 100 sccm to 20,000 sccm. A rare gas serving as a purge gas such as Ar, He, Ne, Xe or the like other than the $N_2$ gas may be used.

[Determination Process (S207)]

After the first purge process (S206) ends, the controller 260 determines whether processes S203 through S206 in the film forming process (S301A) are performed a predetermined number n of cycles or not (wherein n is a natural number). That is, whether a film having a desired thickness is formed on the wafer 200 or not is determined. When the above-described processes S203 through S206 are referred to as one cycle and the cycle is performed at least once [Process S207], an insulating film containing silicon and oxygen, that is, an SiO film may be formed on the wafer 200 to have a predetermined thickness. Also, preferably, the above-described cycle is repeated. Thus, the SiO film having the predetermined thickness is formed on the wafer 200.

When the predetermined number of cycles are not performed (when it is determined to N), a cycle of processes S203 through S206 is repeated. When the predetermined number of cycles are performed (when it is determined to Y), the film forming process (S301A) ends and a transfer pressure adjusting process (S208) and a substrate unloading process (S209) are performed.

Also, in the above-described first gas supply process (S203) or the above-described second gas supply process (S205), when the first gas is supplied, the inert gas is supplied to the second buffer space 232b serving as a second distribution unit, and when the second gas is supplied, the inert gas is supplied to the first buffer space 232a serving as a first distribution unit. Thus, each gas may be prevented from flowing back into the other buffer space.

[Transfer Pressure Adjusting Process (S208)]

In the transfer pressure adjusting process (S208), the process chamber 201 or the transfer space 203 is exhausted through the process chamber exhaust pipe 224 so that an inner pressure of the process chamber 201 or the transfer space 203 is a predetermined pressure (degree of vacuum). In this case, the inner pressure of the process chamber 201 or the transfer space 203 is adjusted to an inner pressure or more of the vacuum transfer chamber 1400. Also, during, before or after the transfer pressure adjusting process (S208), it may be configured to maintain by the lift pin 207 so that the wafer 200 is cooled to a predetermined temperature.

[Substrate Unloading Process (S209)]

After the process chamber 201 has a predetermined pressure in the transfer pressure adjusting process (S208), the gate valve 1490 is opened and the wafer 200 is unloaded into the vacuum transfer chamber 1400 through the transfer space 203.

In this process, the processing of the wafer 200 is performed. Meanwhile, as illustrated in FIGS. 1 and 4, even when a group including an odd number of wafers is transferred to the processing apparatus including an even number of chambers 100, the increase of productivity is required. A method of increasing the productivity includes, for example, increasing the processing number (processing throughput) of the wafers 200 per unit of time, maintaining process performance, reducing the maintenance time, reducing the frequency of maintenance or the like. When the odd number of wafers 200 are transferred to the processing apparatus illustrated in FIGS. 1 and 4, for example, in the process module 110a, it is required that the processing of the wafer 200 is performed in one chamber 100a and the processing of the wafer 200 is performed in the other chamber 100b. The inventors have found the following challenges A to C in a case in which the processing is performed in any one chamber like this. Here, the group including the odd number of wafers includes a single pod 1001 or a plurality of pods 1001 in which the odd number of wafers 200 are stored.

Also, although the challenges A to C to be described below remarkably occur when a small lot including about 11 to 25 sheets is manufactured, the same challenges also occur when a lot including 25 sheets or more is manufactured. Also, when multiple types of products are manufactured with small sized lots, the number of wafers at one lot may vary in each lot. In this case, the number of wafers transferred to the processing apparatus is different from the number of chambers of the processing apparatus. When the number of wafers is different from the number of chambers, there is a challenge in that the chambers not used are generated and thus, productivity is decreased.

[Challenge A]

In a case in which the wafer 200 is transferred to the one chamber 100a and is not transferred to the other chamber 100b, when either a process gas or a reactive gas or both thereof is supplied into the other chamber 100b, either the process gas or the reactive gas or both thereof does not contribute to film formation. Because of this, either the process gas or the reactive gas or both thereof is unnecessarily consumed. Therefore, there is a challenge in that the usage efficiency of the gas is reduced and thus productivity is decreased. Also, since the gas is supplied into two chambers through one gas supply system, the extra consumption of the gas may occur even when the two chamber exhaust systems are individually provided.

[Challenge B]

In the case in which the wafer 200 is transferred to the one chamber 100a and is not transferred to the other chamber 100b, when either a process gas or a reactive gas or both thereof is supplied into the other chamber 100b, a unnecessary film is formed on a component in the other chamber 100b. The component refers to, for example, the substrate support unit 210, and specifically, to the substrate placement surface 211. Therefore, there is a challenge in that productivity is decreased due to the increasing of a thickness of a film formed on a surface of the component, the increasing of maintenance time (cleaning time and the number of replaced parts) by increasing particles or the increasing of the frequency of maintenance (frequencies of cleaning and replacing parts). Also, in order to suppress forming the film on the component in the chamber, for example, on the substrate support unit 210, although there is a case in which a dummy substrate is transferred, it may not suppress that the film is formed on walls of the processing chamber of the chamber. Also, even in this case, since either the process gas or the reactive gas or both thereof does not contribute to film formation, there is a challenge in that the usage efficiency of the gas is reduced. Also, the increasing of maintenance time, the increasing of the frequency of maintenance or the extra consumption of the process gas may occur even when two chamber exhaust systems are individually provided.

[Challenge C]

In the case in which the wafer 200 is transferred to the one chamber 100a and is not transferred to the other chamber 100b, there is a method in which a process gas and a reactive gas are supplied into the one chamber 100a and are not supplied into the other chamber 100b. In this method, an amount of exhaustion of the atmosphere of the one chamber 100a is greater than a predetermined amount compared to the case in which the processing is performed on both of the chambers. Therefore, a condition is different from that of a case in which the wafer 200 is processed in both the chamber 100a and the chamber 100b and thus, there is a challenge in that the processing uniformity in each of the wafers 200 at one lot is reduced. For example, in a case in which the process gas is supplied into the one chamber 100a and is not supplied into the other chamber 100b, a flow velocity of the gas in the one chamber 100a may be greater than a flow velocity of the gas in the one chamber 100a when processed in both chambers. When the flow velocity of the gas is changed in each processing of the wafer 200, there is a challenge in that the process performance in each chamber 100 is changed and productivity is decreased. Also, there is a challenge in that the gas exhausted from the one chamber 100a is entered into the other chamber 100b through the exhaust pipe of the other chamber 100b. Also, the change of the flow velocity of the gas is caused by the change of the exhaustion conductance.

The inventors have found that it is possible to solve the above-described challenges by providing the above-described fourth gas supply unit and controlling the fourth gas supply unit in the substrate processing process as described below. That is, even in the case of processing a group including the odd number of wafers, productivity may be improved. Also, the inventors have found that it is possible to improve the processing uniformity in each wafer 200. Hereinafter, a second substrate processing process (S200B) performed when the wafer 200 is not transferred, will be described. In the following example, a case in which the substrate is transferred to the chamber 100a and the first substrate processing process (S200A) is performed in the chamber 100a as illustrated in FIG. 4, and the substrate is not transferred to the chamber 100b and the second substrate processing process (S200B) is performed in the chamber 100b will be described.

Figure 9:
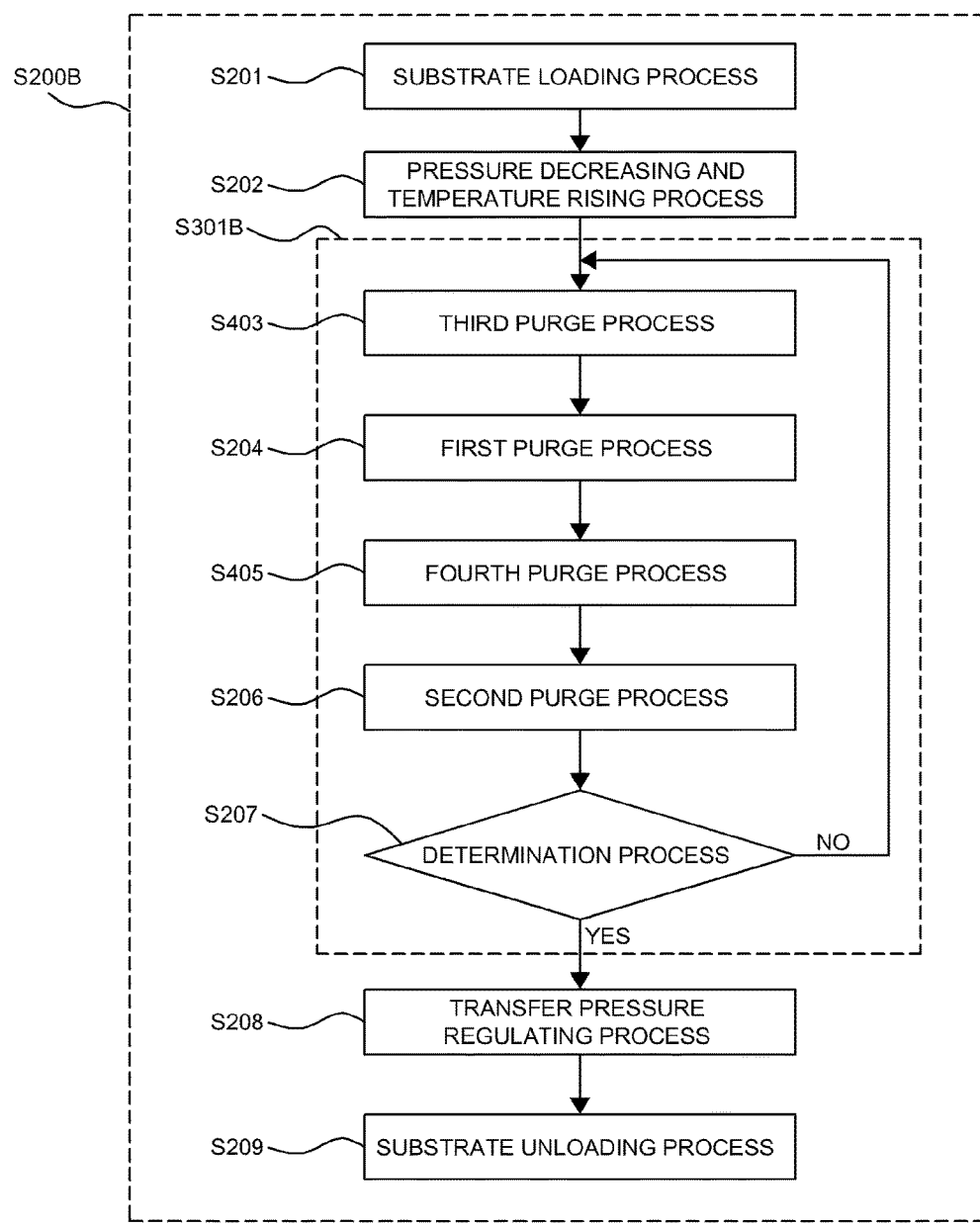
FIG. 9 is a flowchart for describing a second substrate processing process according to an embodiment of the present invention.
Figure 10:
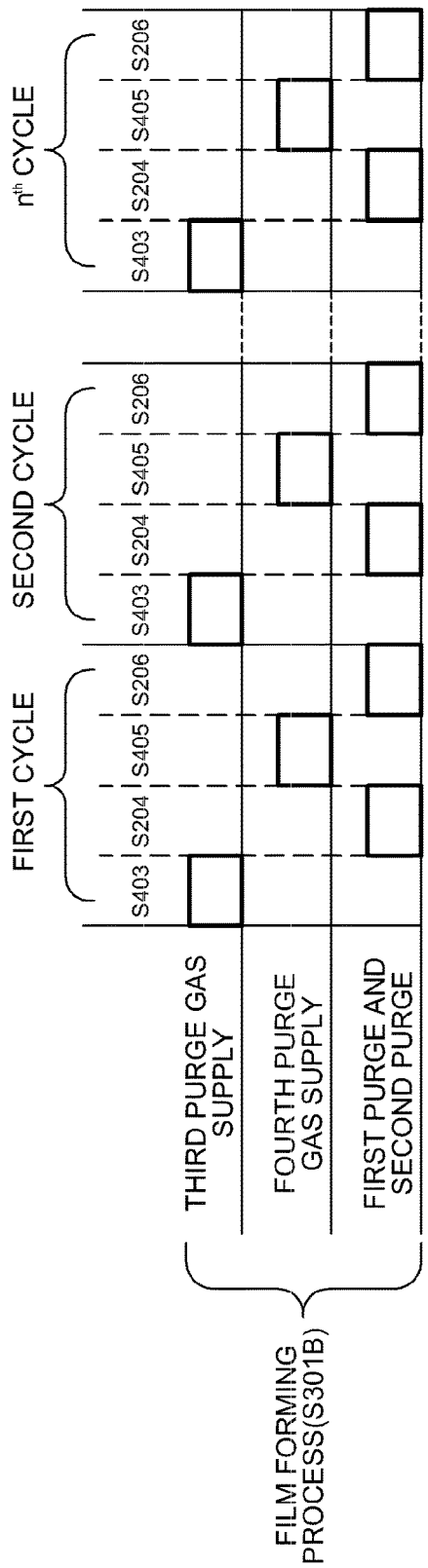
FIG. 10 is a sequence diagram for describing the second substrate processing process according to an embodiment of the present invention.

As illustrated in FIGS. 9 and 10, a film forming process (S301B) corresponding to the film forming process (S301A) shown in FIG. 7 is performed in the second substrate processing process (S200B). The film forming process (S301B) includes performing a third purge process (S403) corresponding to the first process gas supply process (S203) of the first processing process and performing a fourth purge process (S405) corresponding to the second process gas supply process (S205) of the first processing process. Hereinafter, the third purge process (S403) and the fourth purge process (S405) will be described.

[Third Purge Process (S403)]

In the third purge process (S403), while the first process gas supply process (S203) is performed in the chamber 100a, an inert gas is supplied into the process chamber 201 through the first buffer space 232a via the fourth gas supply unit.

Specifically, in a state in which the wafer 200 is not placed on the substrate placement unit 212, the valve 146b is opened and an inert gas of which a flow rate is adjusted by the MFC 145b is supplied into the chamber 100b through the first gas supply pipe 111b. The flow rate of the inert gas is set so that the exhaustion conductance from the chamber 100b in which the second substrate processing process is performed to the process chamber exhaust pipe 224b is equal to the exhaustion conductance from the chamber 100a in which the first substrate processing process is performed to the process chamber exhaust pipe 224a. For example, the flow rate is set to the same flow rate as the flow rate of the first process gas supplied into the chamber 100a. Also, when the molecular weight of the first process gas is different from the molecular weight of the inert gas, there is no need to be the same and the flow rate may be set to be the same exhaustion conductance. Also, here, although it is configured that the inert gas is supplied using the fourth gas supply unit, it may be configured to supply using the third gas supply unit. When it is configured to supply using the third gas supply unit, the number of pipes may be reduced. Meanwhile, in each of the first purge process, the second purge process, the third purge process and the fourth purge process, when the switch of the flow rate is required, it is possible that the change of the flow rate is delayed. Even in the case, when the fourth gas supply unit is provided, the waiting time for the change of the flow rate by the MFC 135 may not be removed. Also, when the inert gas supplied to the process chamber 201 through the fourth gas supply unit has the same flow rate as that in the supply flow path of the first process gas, balance between the exhaustion conductance of the chamber 100a and the exhaustion conductance of the chamber 100b is easily maintained. Also, when the conductance difference is within an acceptable range, other flow paths may be used.

In the third purge process (S403), either before or after or both before and after the process chamber 201 of each chamber is purged, it may be configured to purge the first buffer space 232a. When the first buffer space 232a is purged, the total amount of purge gas supplied into the chamber 100b is configured to be the same as the total amount of purge gas supplied into the chamber 100a. When it is configured in the manner, the exhaust balance between the chamber 100a and the chamber 100b may also be maintained in the purge process of the first buffer space 232a. Also, here, the supply of the purge gas to the first buffer space 232a may be performed through the first gas supply pipe 111a via the third gas supply unit and may be performed through the first gas supply pipe 111a via the fourth gas supply unit.

[Fourth Purge Process (S405)]

In the fourth purge process (S405), while the second process gas supply process (S205) is performed in the chamber 100a, an inert gas is supplied into the process chamber 201 through the second buffer space 232b via the fourth gas supply unit. Specifically, the valve 156b is opened and an inert gas of which a flow rate is adjusted by the MFC 155b is supplied into the chamber 100b through the second gas supply pipe 121b. Also, here, although it is configured that the inert gas is supplied using the fourth gas supply unit, it may be configured to supply using the third gas supply unit. Also, the flow rate of the inert gas in the fourth purge process (S405) is set to the same flow rate as the flow rate of the second process gas supplied into the chamber 100a. Also, when the molecular weight of the second process gas is different from the molecular weight of the inert gas, there is no need to be the same and the flow rate may be set to be the same exhaustion conductance. Also, when the supply of the inert gas to the process chamber 201 through the fourth gas supply unit has the same flow rate as that in the supply flow path of the second process gas, the balance between the exhaustion conductance of the chamber 100a and the exhaustion conductance of the chamber 100b is easily maintained. Also, when the conductance difference is within an acceptable range, other flow paths may be used.

Also, in the fourth purge process (S405), either before or after or both before and after the process chamber 201 of each chamber is purged, it may be configured to purge the second buffer space 232b. When the second buffer space 232b is purged, the total amount of purge gas supplied into the chamber 100b is configured to be the same as the total amount of purge gas supplied into the chamber 100a. When it is configured in the manner, the exhaust balance between the chamber 100a and the chamber 100b may also be maintained in the purge process of the second buffer space 232b. Also, here, the supply of the purge gas to the first buffer space 232a may be performed through the first gas supply pipe 111a via the third gas supply unit and may be performed through the first gas supply pipe 111a via the fourth gas supply unit.

Also, while the fourth purge process (S405) is performed, the second process gas supply process (S205) of the first substrate processing process is performed in the chamber 100a. In the second process gas supply process (S205), in a case in which the second process gas is activated, when the activated second process gas is supplied only into the chamber 100a, the second process gas having high activity may be supplied by the chamber 100a compared to a case in which the second process gas supply process (S205) is performed in two chambers [the chamber 100a and the chamber 100b]. In this case, while the fourth purge process (S405) is performed, it may be configured to exhaust the activated second process gas through the vent line 171b. An exhaust amount of the activated second process gas is set to an amount of the gas corresponding to the amount of the gas supplied into the chamber 100b in the second process gas supply process (S205). Also, here, although it is illustrated that the vent line 171b is provided in the upstream side of the MFC 125b as an example, the vent line 171b may be provided in the downstream side of the MFC 125b. When the vent line 171b is provided in the downstream side of the MFC 125b, the adjustment of the flow rate may be more precisely performed.

Also, in the third purge process (S403) and the fourth purge process (S405), when the fine adjustment of the exhaust balance is difficult, the fine adjustment of the conductance may be performed by the conductance adjusters 226a and 226b. As the case in which the fine adjustment of the exhaust balance is difficult, for example, the adjustment of the flow rate of the gas may be difficult by a difference between lengths of the exhaust pipes or a difference between lengths of the gas supply pipes.

Also, when the third purge process (S403) and the fourth purge process (S405) are performed, there is no need to heat the substrate support unit 210 and thus, the power of the heater 213 may be OFF. When the power supply to the heater 213 is OFF, power consumption may be reduced. Also, since a temperature is excessively decreased when the power supplied to the heater 213 is OFF, the power may be lowered without completely turning OFF when the subsequent substrate processing is affected. Also, when the third purge process (S403) and the fourth purge process (S405) are performed without the wafer 200, a temperature of the substrate support unit 210 may be lowered. When the processing time per one wafer 200 is short, the substrate support unit 210 should be maintained at a predetermined temperature. In this case, the power of the heater 213 may be increased so that the temperature of the substrate support unit 210 is not lowered by the supply of the purge gas.

[Recipe Change Process]

Figure 11:
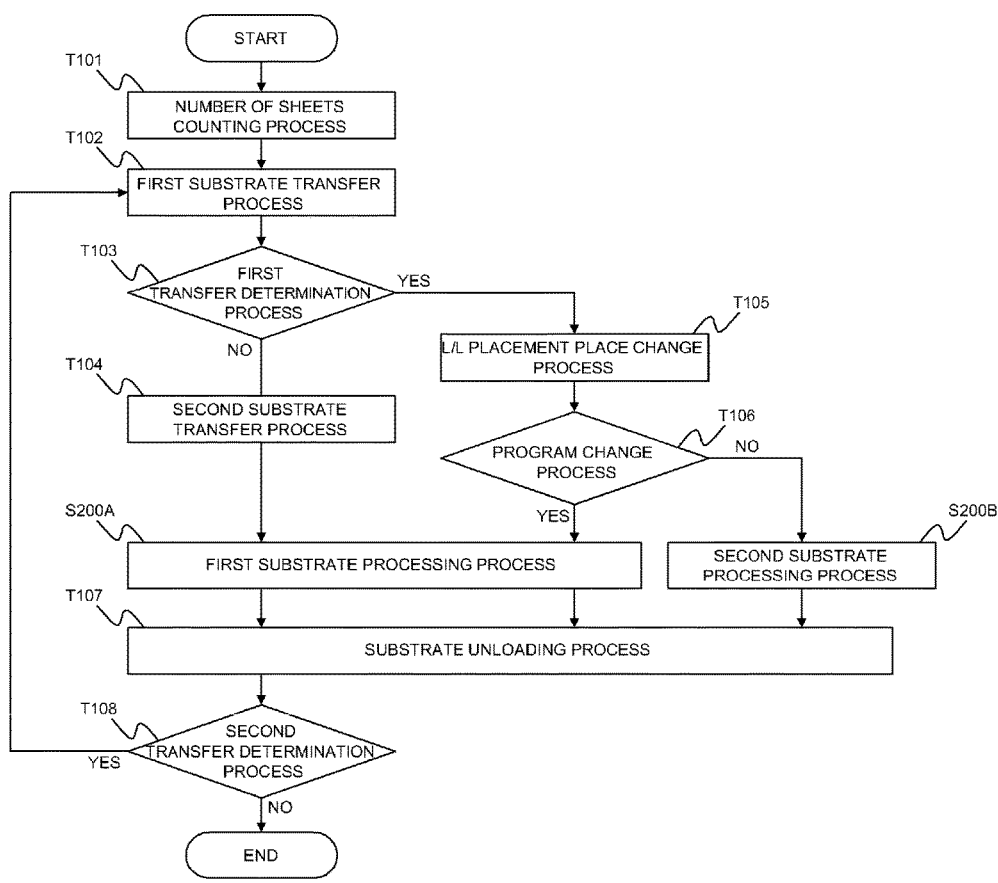
FIG. 11 is a flowchart for describing a substrate processing process performed by the substrate processing system according to an embodiment of the present invention.

Next, the recipe change process, in which the program (recipe) in which the first substrate processing process (S200A) is performed on the computer and the program (recipe) in which the second substrate processing process (S200B) is performed on the computer are switched, will be described with reference to FIGS. 1, 2 and 11.

[Number of Sheets Counting Process (T101)]

First, when the pod 1001 is placed on the IO stage 1100, the number of the wafers 200 stored in the pod 1001 is counted and information on the number of the wafers 200 is recorded in the recording medium.

[Substrate Transferring Process (T102)]

The wafer 200 stored in the pod 1001 is sequentially transferred from the pod 1001 to the load lock chamber 1300 using the atmosphere transfer robot 1220. When two wafers 200 are stored in the load lock chamber 1300, the vacuum transfer robot 1700 transfers the two wafers 200 from the load lock chamber 1300 to the process module 110.

[First Transfer Determination Process (T103)]

In the first transfer determination process (T103), whether the wafer 200 stored in the pod 1001 is a final substrate or not and a substrate is present in the load lock chamber 1300 or not is determined. Alternatively, whether the wafer 200 stored in the pod 1001 is a final substrate of a continuous processing or not and a substrate is present in the load lock chamber 1300 or not is determined. Here, the continuous processing refers to continuously processing a plurality of pods 1001. When the wafer 200 stored in the pod 1001 is the final substrate and there is no substrate in the load lock chamber 1300, a load lock (L/L) placement place change process (T105) is performed, and when the wafer 200 stored in the pod 1001 is not the final substrate and there is a substrate in the load lock chamber 1300, a second substrate transfer process (T104) is performed.

[Second Substrate Transfer Process (T104)]

The second substrate transfer process (T104) is performed after two wafers 200 are stored in the load lock chamber 1300. In the second substrate transfer process (T104), first, an inner pressure of the load lock chamber 1300 is adjusted to have the same pressure as the vacuum transfer chamber 1400. After the pressure is adjusted, the gate valve 1350 is opened and the vacuum transfer robot 1700 transfers the two wafers 200 to the process module 110 which is a target. After the two wafers 200 are transferred to the process module 110, the first substrate processing process (S200A) is performed.

[L/L Placement Place Change Process (T105)]

After the determination, when the wafer 200 is not stored in the load lock chamber 1300, the substrate is placed on one side in the placement surface 1311 in the load lock chamber 1300. Since the placement place determines the chamber 100 used in the processing of the wafer 200, the substrate is placed on the placement surface 1311 corresponding to the chamber which is a transfer target. For example, when the substrate is processed in any one of the chambers 100a, 100c, 100e and 100g, the substrate is placed on the placement surface 1311a. Also, when the substrate is processed in any one of the chambers 100b, 100d, 100f and 100h, the substrate is placed on the placement surface 1311b. Also, when processed using any one of the chambers 100a, 100c, 100e and 100g at an $n^{th}$ lot, the robot 1220 is controlled so that the substrate is transferred to the placement surface 1311b in order to use any one of the chambers 100b, 100d, 100f and 100h at an $(n+1)^{th}$ lot (wherein n is a natural number). When the transfer place is changed, it may suppress the variation of number of uses of the chamber 100 and a time between the maintenance of the chamber 100 and the following maintenance may be increased. That is, the frequency of maintenance is reduced and thus, productivity may be improved. Also, it is possible to increase the processing number (processing throughput) of the wafers 200 per unit time.

[Program Change Process (T106)]

In the L/L placement place change process (T105), whether which chamber among the chambers 100 is a chamber in which the wafer 200 is transferred or a chamber in which the wafer 200 is not transferred in the process module 110 which is a transfer target is determined. The determination is performed, for example, based on the placement information on the L/L. A program is performed so that the first substrate processing process (S200A) is performed in the chamber in which the wafer 200 is transferred, and a program is performed so that the second substrate processing process (S200B) is performed in the chamber in which the wafer 200 is not transferred.

Also, here, it is configured that the program is changed based on the placement information on the L/L, but is not limited thereto. It may be configured that the program is changed by determining the presence or absence of the wafer 200 right before the wafer 200 is transferred to each chamber 100 using a substrate detector 1401 provided in the vacuum transfer chamber 1400. Also, it is confirmed to match with the placement information on the L/L by determining the presence or absence of the wafer 200 using the substrate detector 1401 provided in the vacuum transfer chamber 1400. In a case of matching, the transfer processing is continued and in a case of un-matching, the transfer processing ends and it may be configured to notify either the I/O device 261 or the network 263 or both thereof of the information on the abnormal state.

[Substrate Unloading Process (T107)]

A process in which the wafer 200, in which the first substrate processing process (S200A) and the second substrate processing process (S200B) end, is sequentially transferred from the process module 110 to the pod 1001 is performed.

[Second Substrate Transfer Determination Process (T108)]

Whether an unprocessed wafer 200 is stored in the pod 1001 or not is determined. When the wafer 200 is stored in the pod 1001, the substrate transfer process (T102) is performed, and when the unprocessed wafer 200 is not stored in the pod 1001, the substrate processing process ends.

<Other Embodiment>

Also, it may be configured as follows in addition to the above-described embodiment.

Figure 12:
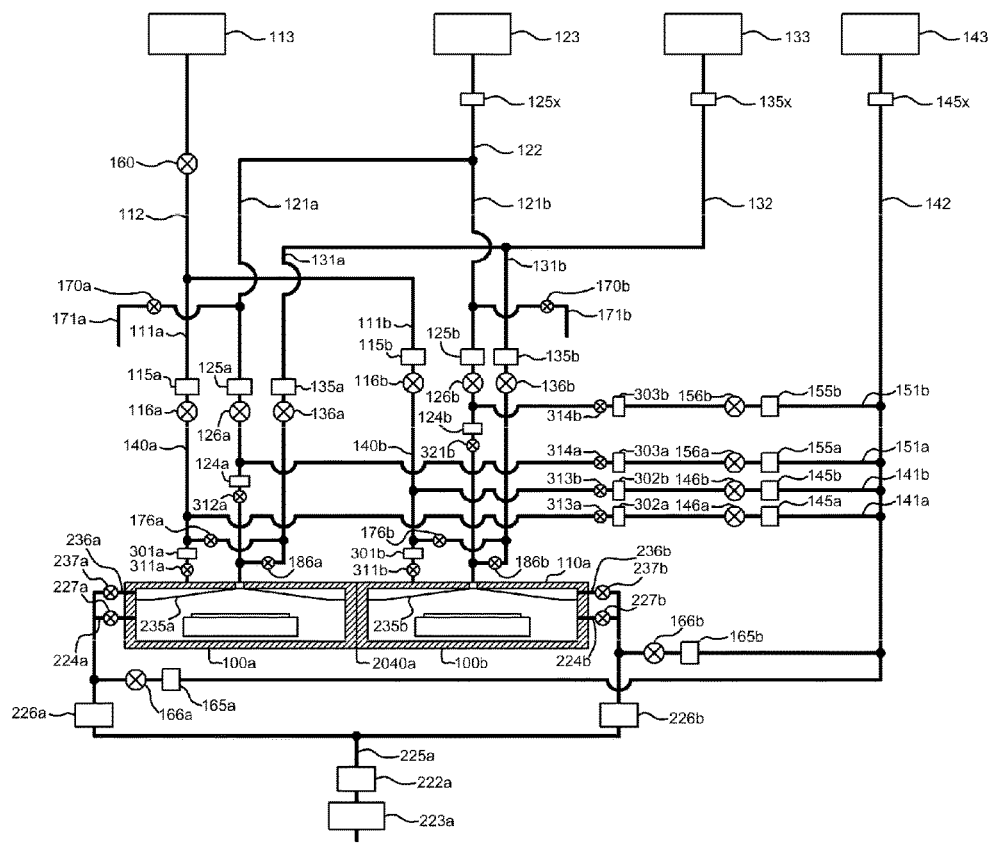
FIG. 12 is a configuration diagram schematically illustrating a substrate processing apparatus according to another embodiment of the present invention.

For example, the substrate processing apparatus illustrated in FIG. 4 may be configured as that illustrated in FIG. 12. In FIG. 12, flash tanks 301a and 301b are provided in the first gas supply pipes 111a and 111b, respectively, and RPUs 124a and 124b are provided in the second gas supply pipes 121a and 121b, respectively. Also, valves 311a, 311b, 312a and 312b are provided in the downstream side of the flash tanks 301a and 301b and the RPUs 124a and 124b, respectively. When it is configured in the manner, a high flow rate of the process gas or the reactive gas having more higher activity may be supplied into each chamber and the processing quality to the wafer 200 may be improved.

Also, flash tanks 302a, 302b, 303a and 303b and valves 313a, 313b, 314a and 314b may be provided in the fourth purge gas supply pipes 141a, 141b, 151a and 151b, respectively. When it is configured in the manner, a high flow rate of the purge gas may be supplied into each chamber in the third purge process (S403) or the fourth purge process (S404).

Also, although it is described above that the method of forming the film in which the source gas and the reactive gas are alternately supplied, other methods may be applied when an amount of vapor phase reaction or an amount of by-products of the source gas and the reactive gas is within an acceptable range. For example, there is a method of overlapping the supply times of the source gas and the reactive gas.

Also, the process module having a pair of two chambers is described above, but is not limited thereto. A process module having a pair of three or more chambers may be used. In a case in which the process module has three or more chambers, when the substrate is transferred to one chamber and is not transferred to at least one chamber other than the one chamber, the process gas is supplied to the one chamber and the inert gas is supplied to the other chambers and thus, the above-described effects may be obtained.

Also, the single wafer apparatus in which the substrate is processed one by one is described above, but is not limited thereto. A batch-type apparatus in which a plurality of substrates are disposed in the process chamber in a vertical direction or a horizontal direction may be used. The technique of the present invention may be applied to an apparatus in which any gas supply system is shared by a plurality of process chambers. Also, as the volume of the process chamber is large, the effect of improvement of the usage efficiency of the gas by applying the technique of the present invention is increased.

Also, although the film forming process is described above, it may be applied to other processes. For example, the other processes include a diffusion processing, an oxidation processing, a nitridation processing, an oxynitridation processing, a reduction processing, an oxidation-reduction processing, an etching processing, a heat processing or the like. For example, the present invention may also be applied when a plasma oxidation processing or a plasma nitriding processing is performed on a substrate surface or a film formed on the substrate using only the reactive gas. Also, the present invention may be applied when a plasma annealing processing is performed using only the reactive gas.

Also, although the method of manufacturing the semiconductor device is described above, the embodiments of the present invention may be applied to other processes in addition to the process of manufacturing the semiconductor device. For example, the other processes include a process of manufacturing a liquid crystal device (LCD), a process of manufacturing solar cells, a process of manufacturing a light-emitting device (LED), a substrate processing process such as a process of processing a glass substrate, a process of processing a ceramic substrate, a process of processing a conductive substrate or the like.

Also, although an example of the method of forming the silicon oxide film using a silicon-containing gas serving as a source gas and an oxygen-containing gas serving as a reactive gas is described above, the present invention may be applied to other methods of forming the film using other gases. For example, the other films include an oxygen-containing film, a nitrogen-containing film, a carbon-containing film, a boron-containing film, a metal-containing film or a film containing a plurality of these elements. Also, the other films include, for example, an SiN film, an AlO film, a ZrO film, a HfO film, a HfAlO film, a ZrAlO film, an SiC film, an SiCN film, an SiBN film, a TiN film, a TiC film, a TiAlC film or the like. When the characteristic (adsorption characteristic, leaving characteristic, vapor pressure or the like) of each of the source gas and the reactive gas used to form the film is compared and the supply position or the structure in the shower head 234 is appropriately changed, the same effect may be obtained.

According to the technique of the present invention, the productivity of a processing apparatus including a plurality of process chambers can be improved.

<Preferred Embodiments of the Present Invention>

Hereinafter, preferred embodiments according to the present invention are supplementary noted.

<Supplementary Note 1>

According to an aspect of the present invention, there is provided a substrate processing apparatus including:

at least two process chambers including a first process chamber and a second process chamber where substrates are processed;

a process gas supply unit configured to supply a process gas into the first process chamber and the second process chamber;

a purge gas supply unit configured to supply a purge gas into the first process chamber and the second process chamber;

an exhaust unit configured to exhaust at least one of the first process chamber and the second process chamber; and a control unit configured to control the process gas supply unit, the purge gas supply unit and the exhaust unit to supply the process gas into the first process chamber to which a substrate is transferred while supplying the purge gas into the second process chamber and exhausting the first process chamber and the second process chamber.

<Supplementary Note 2>

In the substrate processing apparatus of Supplementary note 1, preferably, the control unit is further configured to control the process gas supply unit and the purge gas supply unit in a manner that a flow rate of the purge gas is equal to a flow rate of the process gas.

<Supplementary Note 3>

In the substrate processing apparatus of any one of Supplementary notes 1 and 2, preferably, further includes a reactive gas supply unit configured to supply a reactive gas into the first process chamber and the second process chamber, and the control unit is further configured to control the process gas supply unit, the purge gas supply unit and the reactive gas supply unit to supply the process gas and the reactive gas sequentially into the first process chamber while supplying the purge gas into the second process chamber.

<Supplementary Note 4>

In the substrate processing apparatus of any one of Supplementary notes 1 through 3, preferably, further includes a second purge gas supply unit configured to supply the purge gas into exhaust pipes connected to the first process chamber and the second process chamber, and the control unit is further configured to control the process gas supply unit and the second purge gas supply unit to supply the process gas into the first process chamber while supplying the purge gas into the exhaust pipe connected to the second process chamber.

<Supplementary Note 5>

In the substrate processing apparatus of any one of Supplementary notes 1 through 4, preferably, further includes a conductance adjusting unit configured to adjust conductances of exhaust pipes connected to the first process chamber and the second process chamber, and the control unit is further configured to control the conductance adjusting unit to adjust the conductances of the exhaust pipes in a manner that an inner pressure of the first process chamber is equal to that of the second process chamber.

<Supplementary Note 6>

According to another aspect of the present invention, there is provided a method of manufacturing a semiconductor device or a substrate processing method including:

(a) transferring a substrate to a first process chamber;

(b) supplying a purge gas into a second process chamber while supplying a process gas into the first process chamber; and (c) exhausting at least one of the first process chamber and the second process chamber while performing (b).

<Supplementary Note 7>

In the method of Supplementary note 6, preferably, a flow rate of the purge gas is equal to a flow rate of the process gas in (b).

<Supplementary Note 8>

In the method of any one of Supplementary notes 6 and 7, preferably, further includes:

(d) supplying a reactive gas into the first process chamber; and (e) supplying the purge gas into the second process chamber while performing (d) in a manner that a flow rate of the purge gas is equal to a flow rate of the reactive gas in (d).

<Supplementary Note 9>

In the method of any one of Supplementary notes 6 through 8, preferably, the purge gas is supplied to an exhaust pipe connected to the second process chamber in (b).

<Supplementary Note 10>

In the method of any one of Supplementary notes 6 through 9, preferably, further includes (f) controlling a conductance adjusting unit of an exhaust pipe connected to the second process chamber in a manner that an exhaustion conductance of the second process chamber is equal to that of the first process chamber in (b).

<Supplementary Note 11>

According to still another aspect of the present invention, there is provided a program or a non-transitory computer-readable recording medium storing a program for causing a computer to control a substrate processing apparatus to perform:

(a) transferring a substrate to a first process chamber;

(b) supplying a purge gas into a second process chamber while supplying a process gas into the first process chamber; and (c) exhausting at least one of the first process chamber and the second process chamber while performing (b).

<Supplementary Note 12>

According to still another aspect of the present invention, there is provided a substrate processing apparatus including:

at least two process chambers including a first process chamber and a second process chamber where substrates are processed;

a process gas supply unit configured to supply a process gas into the first process chamber and the second process chamber;

a purge gas supply unit configured to supply a purge gas into the first process chamber and the second process chamber;

an exhaust unit configured to exhaust at least one of the first process chamber and the second process chamber; and a stage where a substrate container accommodating the substrates is placed;

a load lock chamber installed between the stage and the at least two process chambers;

a first transfer robot configured to transfer the substrates between the stage and the load lock chamber;

a second transfer robot including a fork portion capable of supporting at least two substrates and configured to transfer the substrates between the load lock chamber and the at least two process chambers; and a control unit configured to control the process gas supply unit, the purge gas supply unit, the exhaust unit, the first transfer robot and the second transfer robot to perform a first substrate process in the first process chamber to which a substrate is transferred while performing a second substrate process in the second process chamber.

<Supplementary Note 13>

In the substrate processing apparatus of Supplementary note 12, preferably, further includes a reactive gas supply unit configured to supply a reactive gas into the first process chamber and the second process chamber, and the control unit is further configured to control the process gas supply unit, the purge gas supply unit and the reactive gas supply unit to supply the process gas, the purge gas and the reactive gas into the first process chamber sequentially a predetermined number of times in the first substrate process, to supply the purge gas into the second process chamber in the second substrate process while supplying the process gas in the first substrate process and to supply the purge gas into the second process chamber in the second substrate process while supplying the reactive gas in the first substrate process.

<Supplementary Note 14>

In the substrate processing apparatus of Supplementary note 13, preferably, the control unit is further configured to control the process gas supply unit, the purge gas supply unit and the reactive gas supply unit in a manner that a flow rate of the purge gas supplied in the second substrate process while supplying the process gas in the first substrate process is equal to a flow rate of the process gas in the first substrate process and a flow rate of the purge gas supplied in the second substrate process while supplying the reactive gas in the first substrate process is equal to a flow rate of the reactive gas in the first substrate process.

<Supplementary Note 15>

In the substrate processing apparatus of any one of Supplementary notes 12 through 14, preferably, further includes a second purge gas supply unit configured to supply the purge gas into exhaust pipes connected to the first process chamber and the second process chamber, and the control unit is further configured to control the process gas supply unit, the reactive gas supply unit and the second purge gas supply unit to supply the purge gas into the exhaust pipe connected to the second process chamber while supplying the process gas and the reactive gas into the first process chamber in the first substrate process.

<Supplementary Note 16>

In the substrate processing apparatus of any one of Supplementary notes 12 through 15, preferably, further includes a conductance adjusting unit configured to adjust conductances of exhaust pipes connected to the first process chamber and the second process chamber, and the control unit is further configured to control the conductance adjusting unit to adjust the conductances of the exhaust pipes in a manner that an inner pressure of the first process chamber is equal to that of the second process chamber while performing the first substrate process.

<Supplementary Note 17>

According to still another aspect of the present invention, there is provided a substrate processing apparatus including:

at least two process chambers including a first process chamber and a second process chamber where substrates are processed;

a process gas supply unit configured to supply a process gas into the first process chamber and the second process chamber;

a reactive gas supply unit configured to supply a reactive gas into the first process chamber and the second process chamber;

a purge gas supply unit configured to supply a purge gas into the first process chamber and the second process chamber;

an exhaust unit configured to exhaust at least one of the first process chamber and the second process chamber; and a stage where a substrate container accommodating the substrates is placed;

a load lock chamber installed between the stage and the at least two process chambers;

a first transfer robot configured to transfer the substrates between the stage and the load lock chamber;

a second transfer robot including a fork portion capable of supporting at least two substrates and configured to transfer the substrates between the load lock chamber and the at least two process chambers; and a control unit configured to control the process gas supply unit, the reactive gas supply unit, the purge gas supply unit, the exhaust unit, the first transfer robot and the second transfer robot to perform:

(a) transferring a first substrate from the load lock chamber to the second process chamber and performing a first substrate process in the second process chamber while performing a second substrate process in the first process chamber at an $N^{th}$ lot, wherein N is a natural number; and (b) transferring a second substrate from the load lock chamber to the first process chamber and performing the first substrate process in the first process chamber while performing the second substrate process in the second process chamber at an $(N+1)^{th}$ lot.

<Supplementary Note 18>

In the substrate processing apparatus of Supplementary note 17, preferably, the control unit is further configured to control the process gas supply unit, the reactive gas supply unit and the purge gas supply unit in a manner that the process gas and the reactive gas are supplied alternately in the first substrate process, the purge gas is supplied in the second substrate process while supplying the process gas in the first substrate process and the purge gas is supplied in the second substrate process while supplying the reactive gas in the first substrate process.

<Supplementary Note 19>

In the substrate processing apparatus of any one of Supplementary notes 17 and 18, preferably, the control unit is further configured to control the process gas supply unit, the reactive gas supply unit and the purge gas supply unit in a manner that a flow rate of the purge gas supplied in the second substrate process while supplying the process gas in the first substrate process is equal to a flow rate of the process gas in the first substrate process and a flow rate of the purge gas supplied in the second substrate process while supplying the reactive gas in the first substrate process is equal to a flow rate of the reactive gas in the first substrate process.

<Supplementary Note 20>

In the substrate processing apparatus of any one of Supplementary notes 17 through 19, preferably, further includes a second purge gas supply unit configured to supply the purge gas into exhaust pipes connected to the first process chamber and the second process chamber, and the control unit is further configured to control the process gas supply unit, the reactive gas supply unit and the second purge gas supply unit to supply the purge gas into the exhaust pipes in the second substrate process while supplying the process gas and the purge gas in the first substrate process.

<Supplementary Note 21>

In the substrate processing apparatus of any one of Supplementary notes 17 through 20, preferably, further includes a conductance adjusting unit configured to adjust conductances of exhaust pipes connected to the first process chamber and the second process chamber, and the control unit is further configured to control the conductance adjusting unit to adjust the conductances of the exhaust pipes in a manner that an inner pressure of the first process chamber is equal to that of the second process chamber while performing the first substrate process and the second substrate process.

<Supplementary Note 22>

According to still another aspect of the present invention, there is provided a substrate processing apparatus or an apparatus of manufacturing a semiconductor device including:

a plurality of process chambers where substrates are processed;

a process gas supply unit configured to supply a process gas into each of the plurality of process chambers;

a purge gas supply unit configured to supply a purge gas into each of the plurality of process chambers;

an exhaust unit configured to exhaust each of the plurality of process chambers; and a control unit configured to control the process gas supply unit, the purge gas supply unit and the exhaust unit to supply the process gas into a first process chamber of the plurality of process chambers to which a substrate is transferred while supplying the purge gas into process chambers other than the first process chamber and exhausting the plurality of process chambers.

<Supplementary Note 23>

According to still another aspect of the present invention, there is provided a method of manufacturing a semiconductor device or a substrate processing method including:

(a) transferring a substrate to a first process chamber of a plurality of process chambers;

(b) supplying a purge gas into process chambers other than the first process chamber while supplying a process gas into the first process chamber; and (c) exhausting at least one of the first process chamber and the process chambers other than the first process chamber while performing (b).

<Supplementary Note 24>

According to still another aspect of the present invention, there is provided a program or a non-transitory computer-readable recording medium storing a program for causing a computer to control a substrate processing apparatus to perform:

(a) transferring a substrate to a first process chamber of a plurality of process chambers;

(b) supplying a purge gas into process chambers other than the first process chamber while supplying a process gas into the first process chamber; and (c) exhausting at least one of the first process chamber and the process chambers other than the first process chamber while performing (b).

What is claimed is:

1. A method of manufacturing a semiconductor device in a substrate processing apparatus comprising a first chamber including a first substrate placement unit whereon a first substrate is placed and a second chamber including a second substrate placement unit whereon a second substrate is placed, the method, comprising:

(a) transferring only the first substrate into the first chamber without the second substrate loaded in the second chamber;

(b) simultaneously:
  supplying a process gas onto the first substrate in the first chamber; and
  exhausting the process gas from the first chamber through a first exhaust pipe connected to the first chamber; and (c) simultaneously:
  supplying a purge gas onto a surface of the second substrate placement unit disposed in the second chamber; and
  exhausting the purge gas from the second chamber through a second exhaust pipe connected to the second chamber, while adjusting at least one of a flow rate of the purge gas and a conductance of a second exhaust pipe connected to the second chamber such that the conductance of the second exhaust pipe is the same as that of the first exhaust pipe, wherein (b) and (c) start simultaneously after performing (a), and end simultaneously, and the first exhaust pipe and the second exhaust pipe are exhausted by a single exhaust unit in (b) and (c).

2. The method of claim 1, wherein an amount of the purge gas supplied onto the surface of the second substrate placement unit in (c) is equal to that of the process gas supplied onto the first substrate in (b).

3. The method of claim 1, wherein a second process gas is further supplied a predetermined number of times in (b) in alternate manner, and the purge gas is continuously supplied in (c) from a start of supplying the first process gas or the second process gas until the first process gas or the second process gas is supplied the predetermined number of times.

4. The method of claim 2, wherein a second process gas is further supplied a predetermined number of times in (b) in alternate manner, and the purge gas is continuously supplied in (c) from a start of supplying the first process gas or the second process gas until the first process gas or the second process gas is supplied the predetermined number of times.

5. The method of claim 1, wherein an amount of power supplied to a second heating unit installed in the second substrate placement unit is greater than that of power supplied to a first heating unit installed in the first substrate placement unit in (c).

6. The method of claim 2, wherein an amount of power supplied to a second heating unit installed in the second substrate placement unit is greater than that of power supplied to a first heating unit installed in the first substrate placement unit in (c).

7. The method of claim 1, wherein a second heating unit installed in the second substrate placement unit is turned off and a first heating unit installed in the first substrate placement unit is turned on in (c).

8. The method of claim 2, wherein a second heating unit installed in the second substrate placement unit is turned off and a first heating unit installed in the first substrate placement unit is turned on in (c).

9. The method of claim 1, further comprising:

(d) placing the second substrate on the second substrate placement unit with the first substrate placed on the first substrate placement unit; and (e) supplying the process gas onto the second substrate and exhausting the process gas from the second chamber through the second exhaust pipe after performing (d).

10. The method of claim 1, wherein (c) is performed without the process gas being supplied onto the second substrate placement unit.

* * * * *